(12) United States Patent
    Dutta et al.

(10) Patent No.: US 12,575,394 B2
(45) Date of Patent: Mar. 10, 2026

(54) THREE-DIMENSIONAL INTEGRATED CIRCUIT WITH TOP CHIP INCLUDING LOCAL INTERCONNECT FOR BODY-SOURCE COUPLING

(71) Applicant: GlobalFoundries U.S. Inc., Malta, NY (US)

(72) Inventors: Anupam Dutta, Kolkata (IN);
    Satyasuresh VVss Choppalli,
    Bangalore (IN); Rui Tze Toh,
    Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 360 days.

(21) Appl. No.: 18/340,220

(22) Filed: Jun. 23, 2023

(65) Prior Publication Data

US 2024/0429128 A1    Dec. 26, 2024

(51) Int. Cl.

| | |
|---|---|
| *H01L 23/48* | (2006.01) |
| *H01L 21/768* | (2006.01) |
| *H01L 23/522* | (2006.01) |
| *H01L 23/528* | (2006.01) |
| *H01L 25/065* | (2023.01) |

(Continued)

(52) U.S. Cl.
CPC ...... *H01L 23/481* (2013.01); *H01L 21/76898* (2013.01); *H01L 23/5226* (2013.01); *H01L 23/5283* (2013.01); *H01L 25/0657* (2013.01); *H10D 30/711* (2025.01); *H01L 2225/06544* (2013.01)

(58) Field of Classification Search
CPC ............. H01L 23/481; H01L 21/76898; H01L 23/5226; H01L 23/5283; H01L 25/0657; H10D 30/711
See application file for complete search history.

(56) References Cited

U.S. PATENT DOCUMENTS

| | | | |
|---|---|---|---|
| 5,314,841 A | 5/1994 | Brady et al. | |
| 5,930,605 A | 7/1999 | Mistry et al. | |

(Continued)

OTHER PUBLICATIONS

U.S. Appl. No. 18/340,230, Application as Filed on Jun. 22, 2023, 50 pages.

(Continued)

*Primary Examiner* — Tracie Y Green
(74) *Attorney, Agent, or Firm* — Francois Pagette; Hoffman Warnick LLC

(57) ABSTRACT

Disclosed structures and methods include a top chip flipped relative to a bottom chip and bonded thereto. On the top chip, dielectric material layers separate a transistor from the bottom chip. The transistor includes source and drain regions; a body region on a channel region between the source and drain regions; and a gate structure adjacent to and between the channel region and the dielectric material layers. Alternatively, the transistor includes: a source region between drain regions; a body region on a channel region between the source region and each drain region; and gate structures adjacent to and between the channel regions and the dielectric material layers. The first chip also includes an insulator layer on the transistor opposite the dielectric material layers, a trench in the insulator layer extending to the source and body regions, and a local interconnect at the bottom of the trench.

20 Claims, 20 Drawing Sheets

(51) Int. Cl.
   H01L 29/78      (2006.01)
   H10D 30/69      (2025.01)

(56)            References Cited

U.S. PATENT DOCUMENTS

| | | | |
|---|---|---|---|
| 6,864,156 | B1 | 3/2005 | Conn |
| 8,409,989 | B2 | 4/2013 | Pei et al. |
| 2002/0115244 | A1 | 8/2002 | Park et al. |
| 2011/0193166 | A1 | 8/2011 | Liang et al. |
| 2015/0054149 | A1 | 2/2015 | Purushothaman et al. |
| 2019/0348514 | A1 | 11/2019 | Ellis-Monaghan |
| 2020/0185397 | A1* | 6/2020 | Chibvongodze ....... H10B 43/35 |
| 2020/0259018 | A1* | 8/2020 | Rami ...................... H10D 30/43 |
| 2020/0328186 | A1* | 10/2020 | Liu ......................... H01L 25/18 |
| 2021/0167180 | A1* | 6/2021 | Kar ...................... H10D 62/159 |
| 2023/0307283 | A1* | 9/2023 | Or-Bach .............. H01L 23/544 |

OTHER PUBLICATIONS

Luo et al., "A Tunnel Diode Body Contact Structure for High-Performance SOI MOSFETs," IEEE Transactions on Electron Devices, vol. 59, No. 1, Jan. 2012, pp. 101-107.

Narayanan et al., "Analysis of Kink Reduction in SOI MOSFET Using Selective Back Oxide Structure," Hindawi Publishing Corporation, Active and Passive Electronic Components, vol. 2012, Article ID 565827, 9 pages.

Kuehne et al., "SOI MOSFET with Buried Body Strap by Wager Bonding," IEEE Transactions on Electron Devices, vol. 45, No. 5, May 1998, pp. 1084-1091.

U.S. Appl. No. 18/340,230, Office Action dated Oct. 24, 2025, 17 pages.

U.S. Appl. No. 18/340,230 Amendment to Office Action filed Nov. 4, 2025, 14 pages.

* cited by examiner

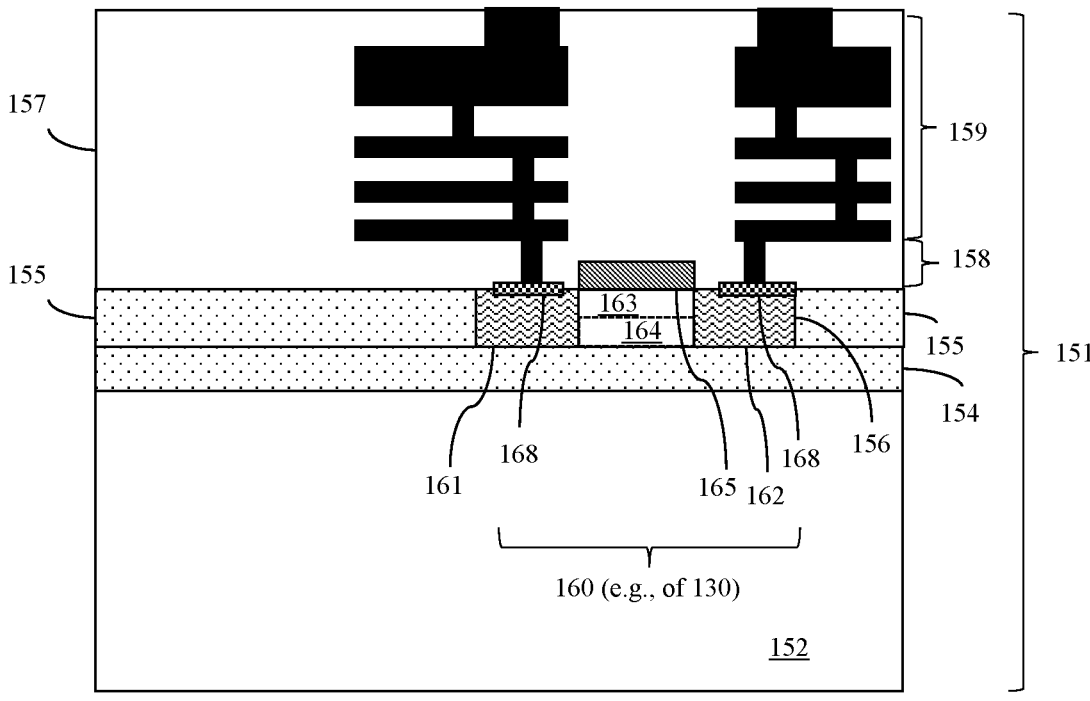
FIG. 3.1

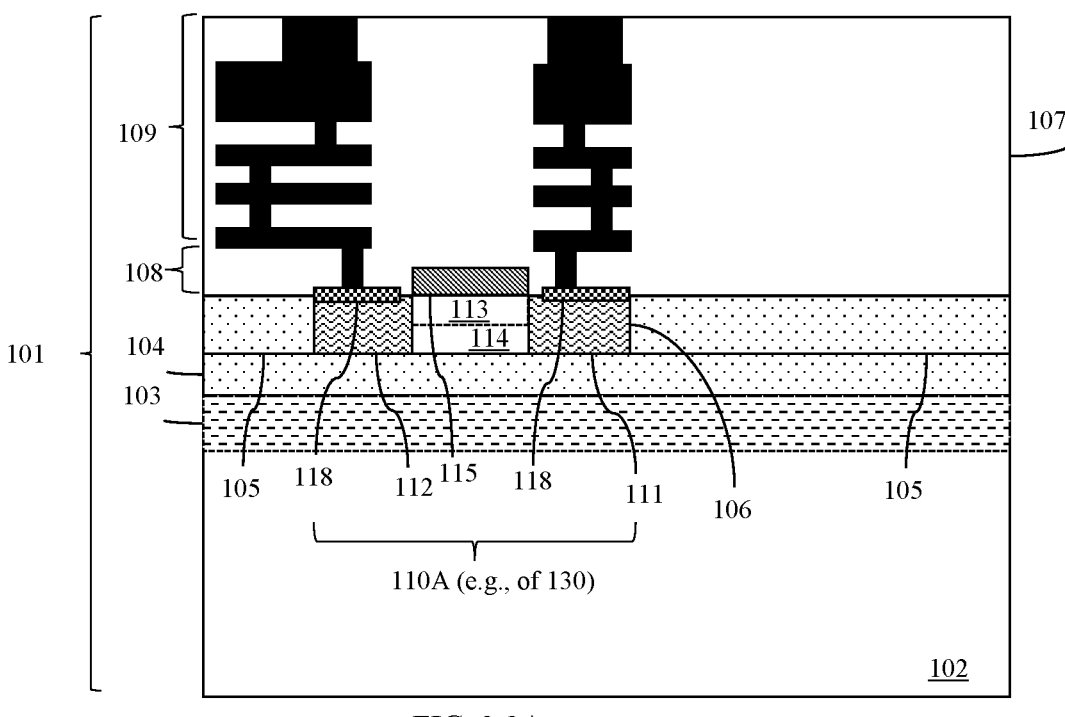
FIG. 3.2A
FIG. 3.2B

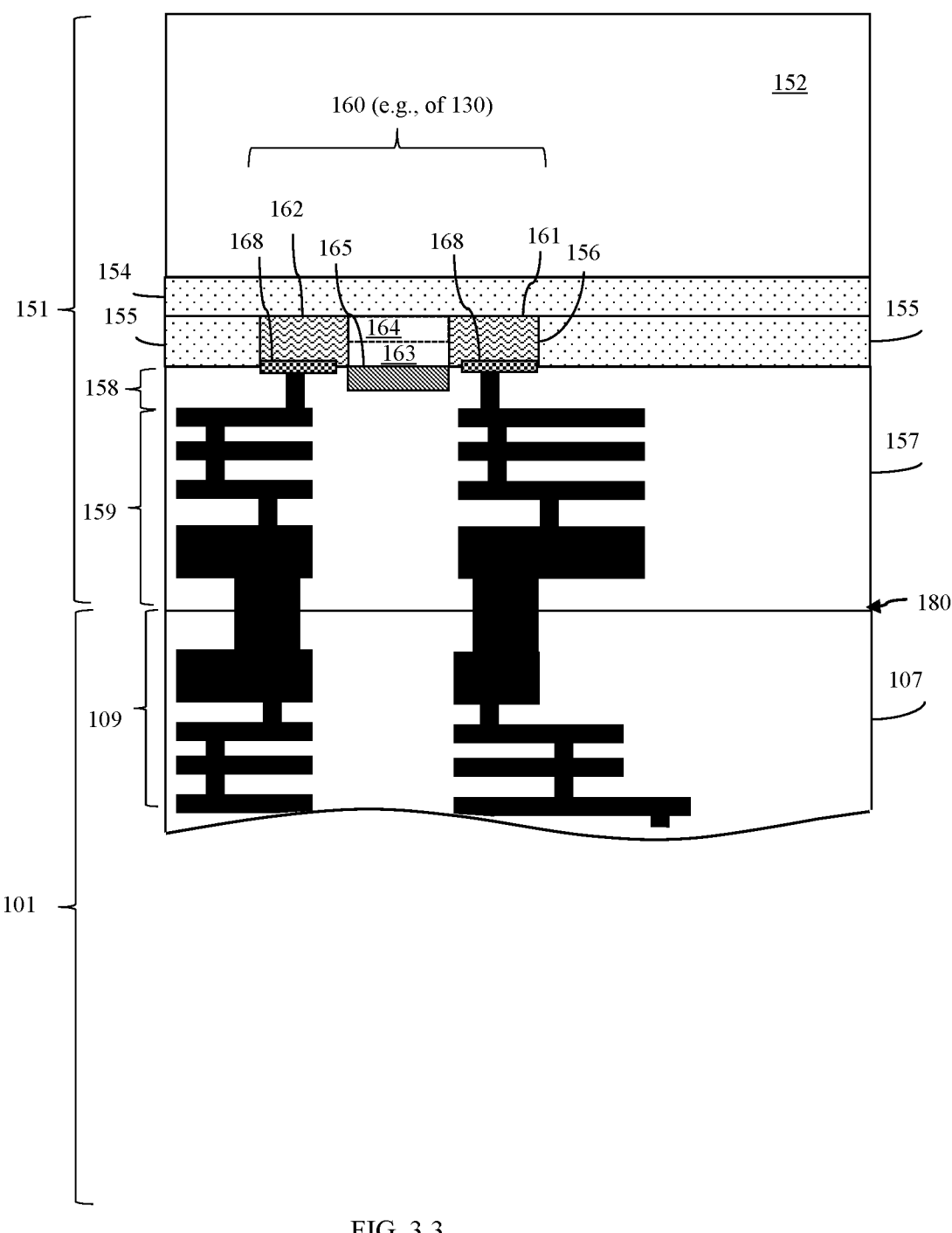
FIG. 3.3

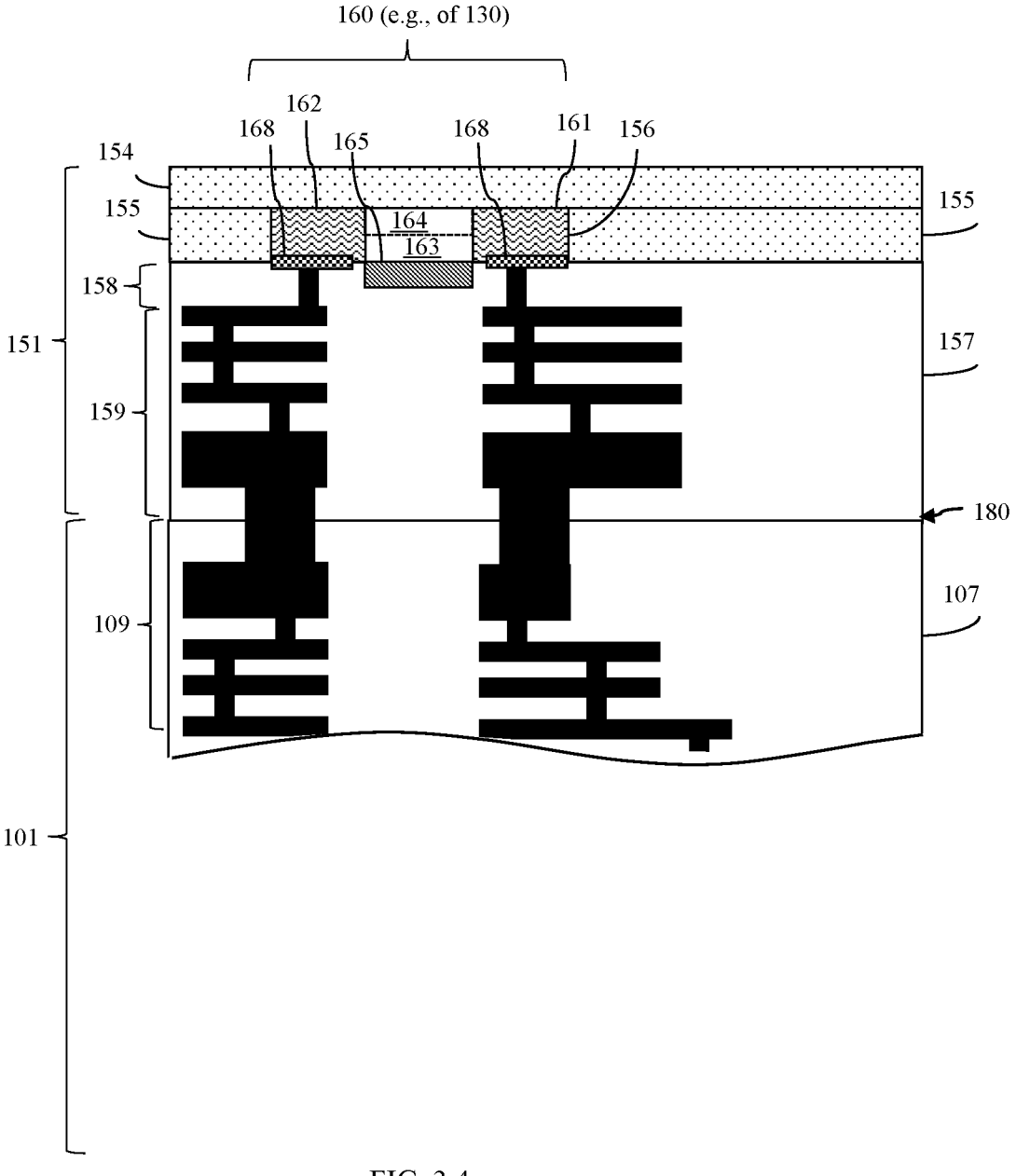
FIG. 3.4

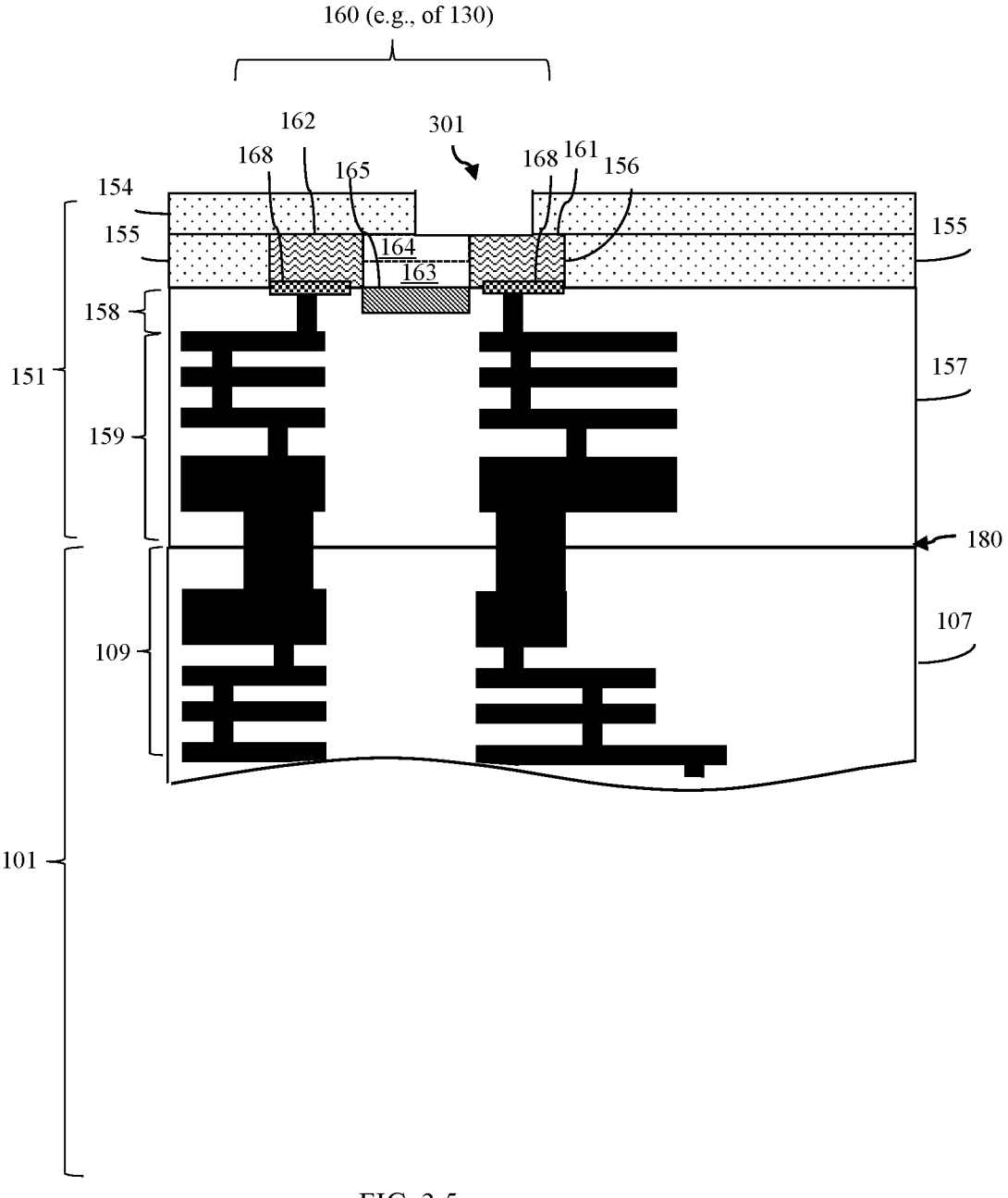
FIG. 3.5

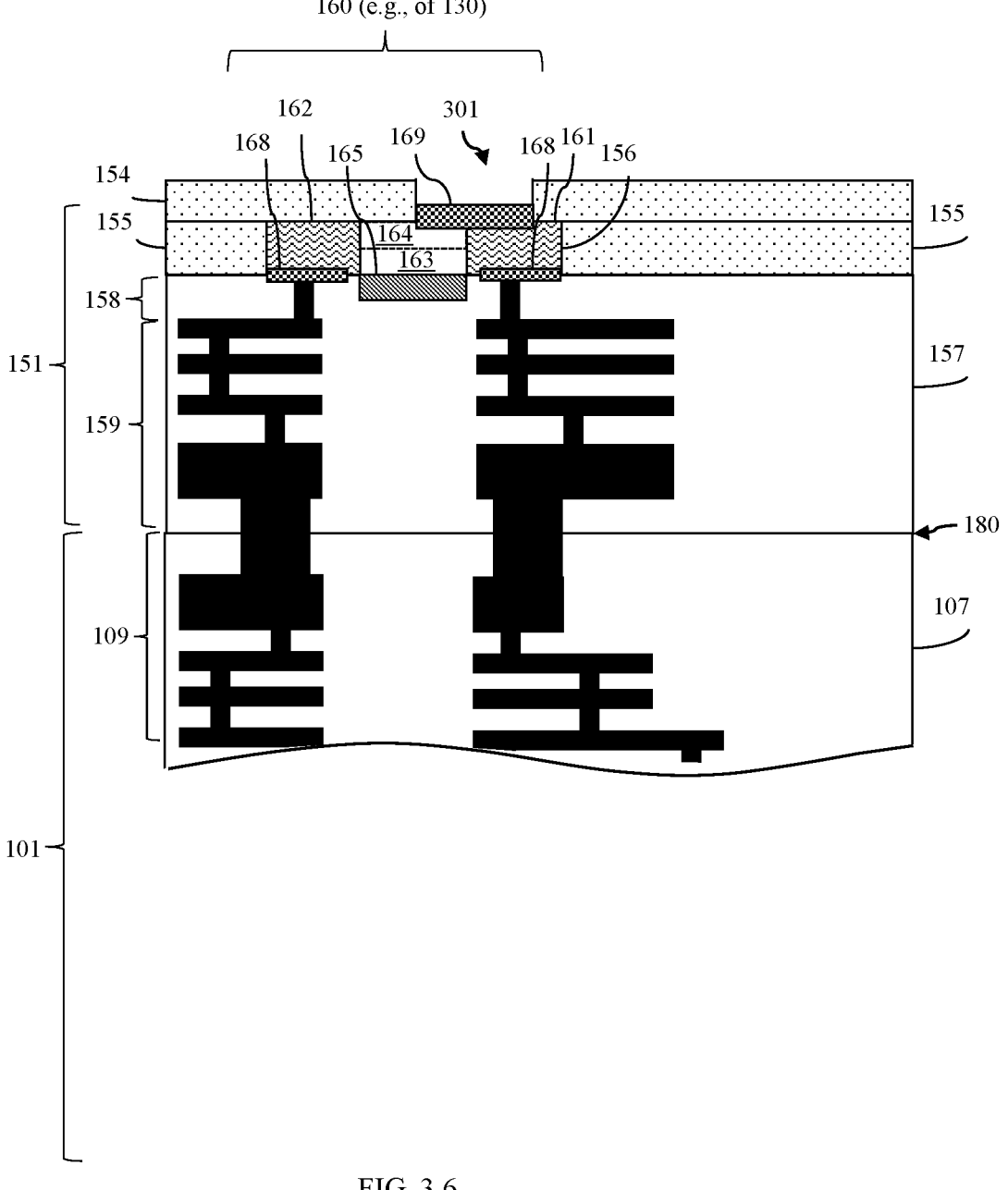
FIG. 3.6

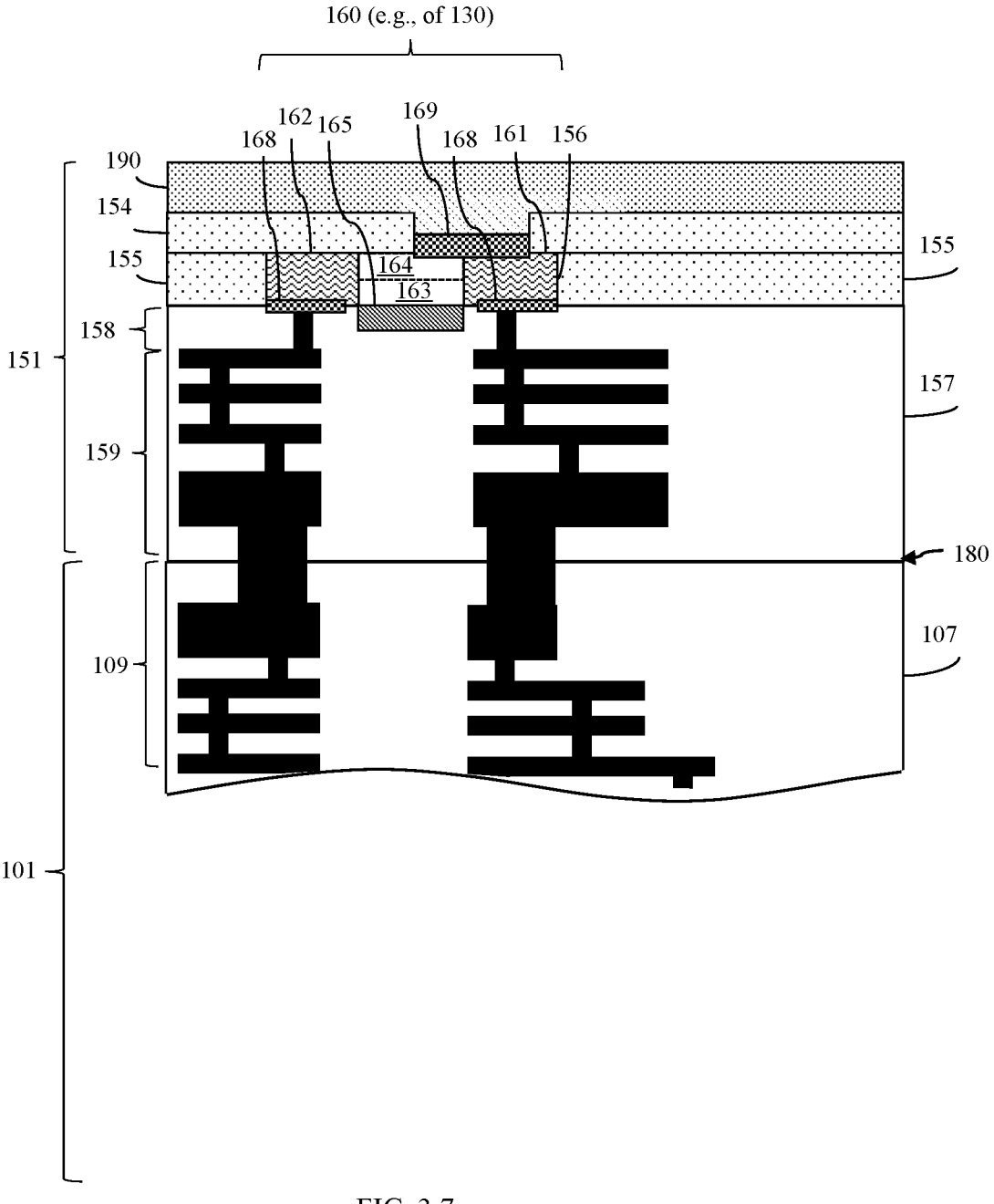
FIG. 3.7

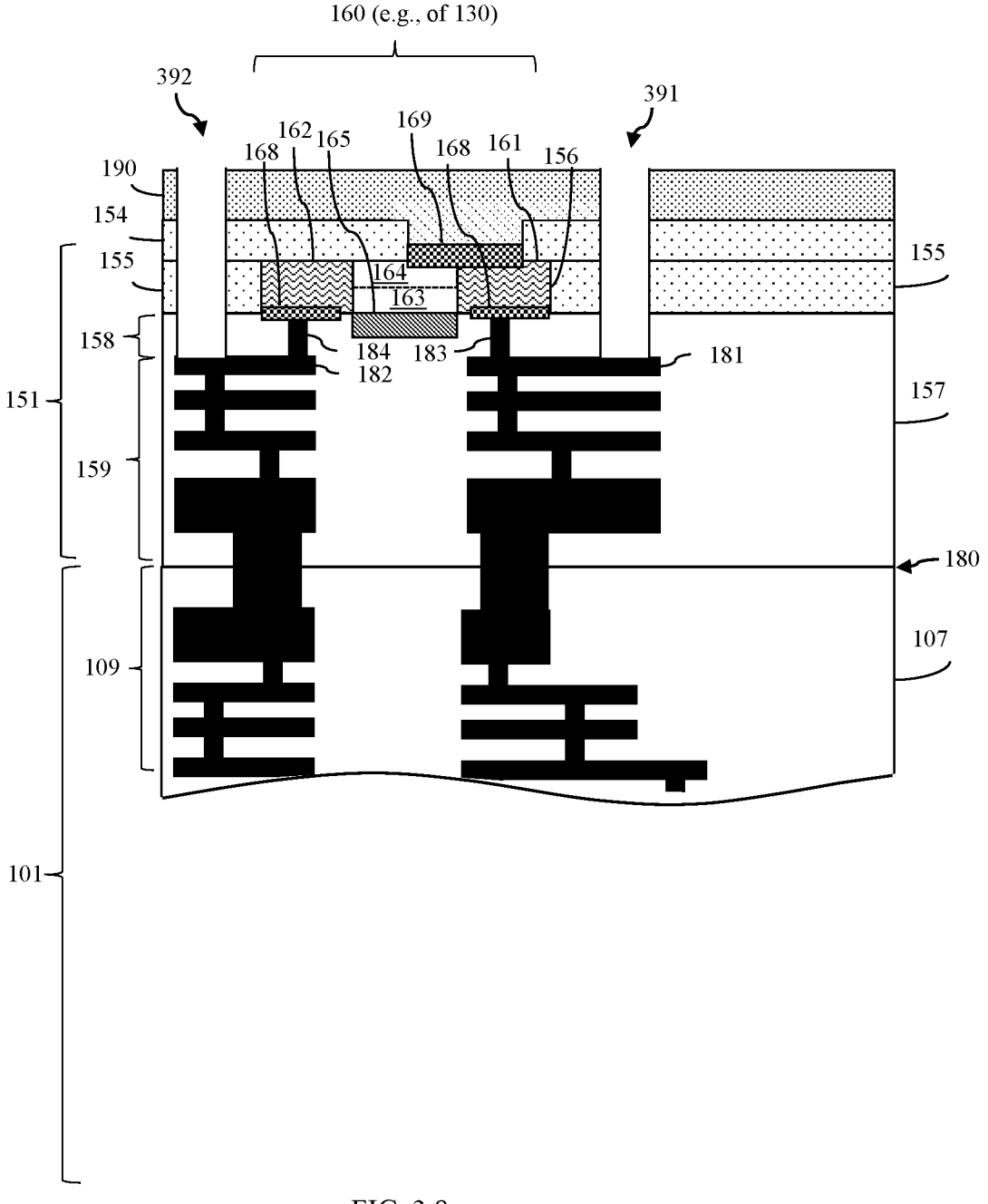
FIG. 3.8

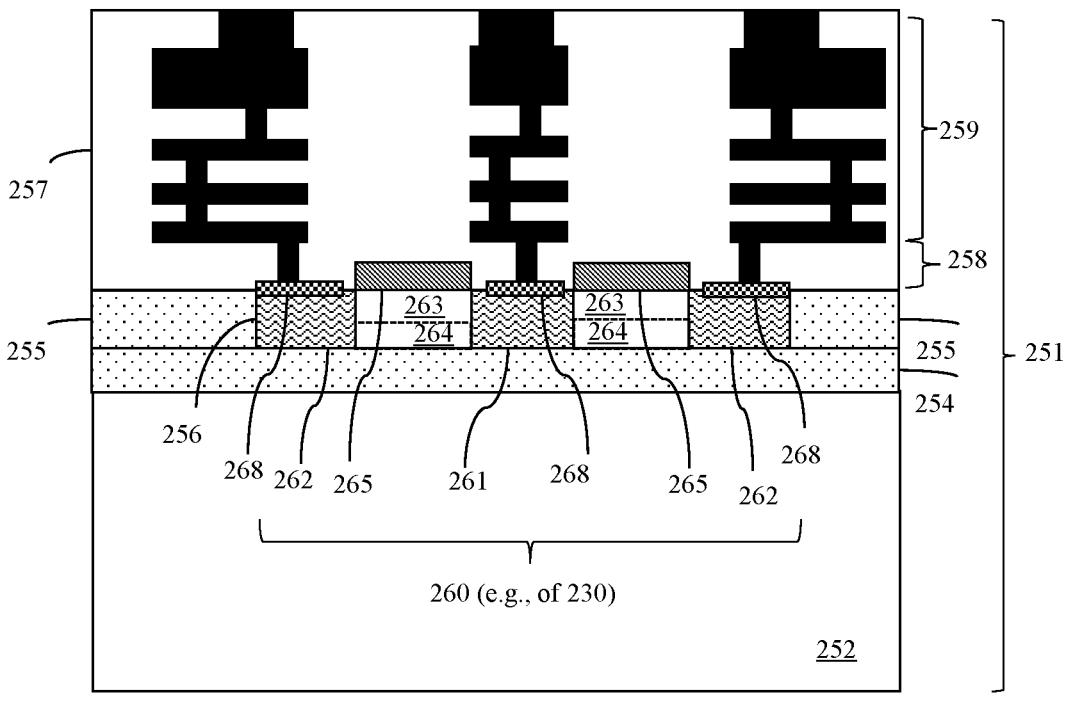
FIG. 4.1

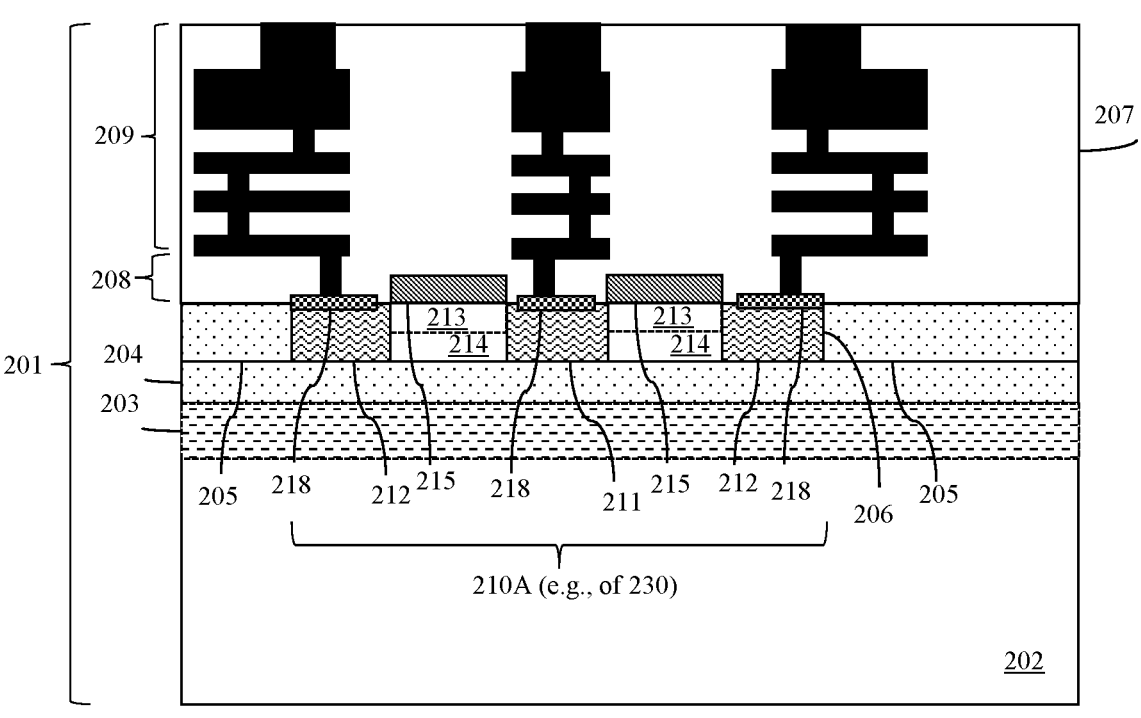
FIG. 4.2A
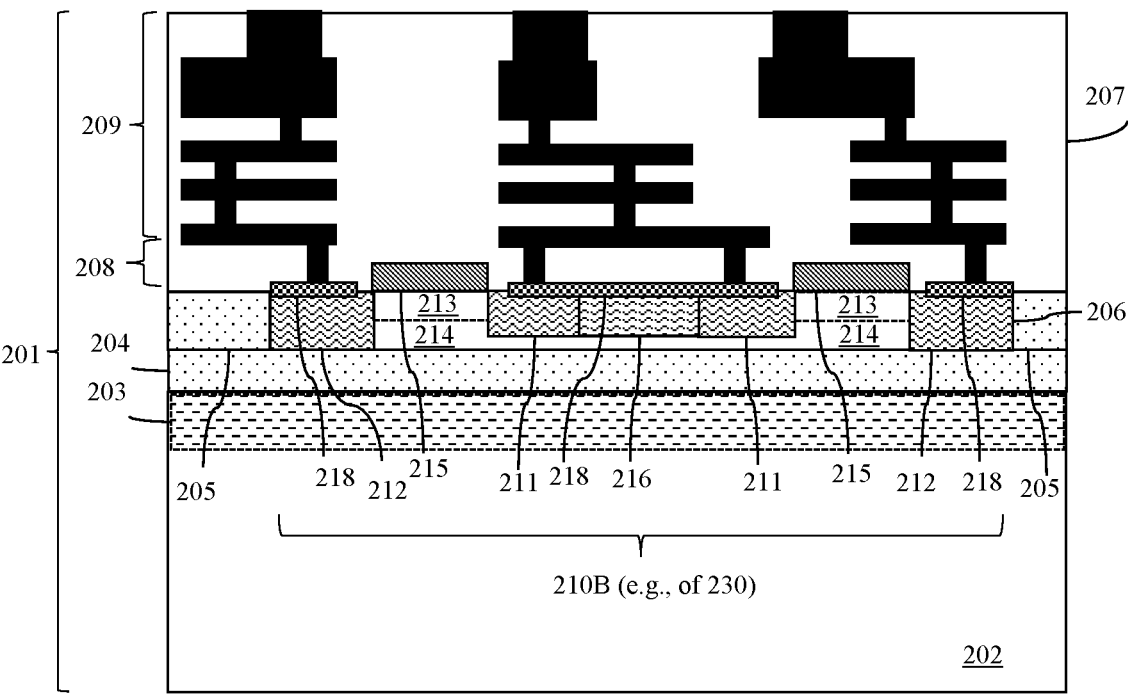
FIG. 4.2B

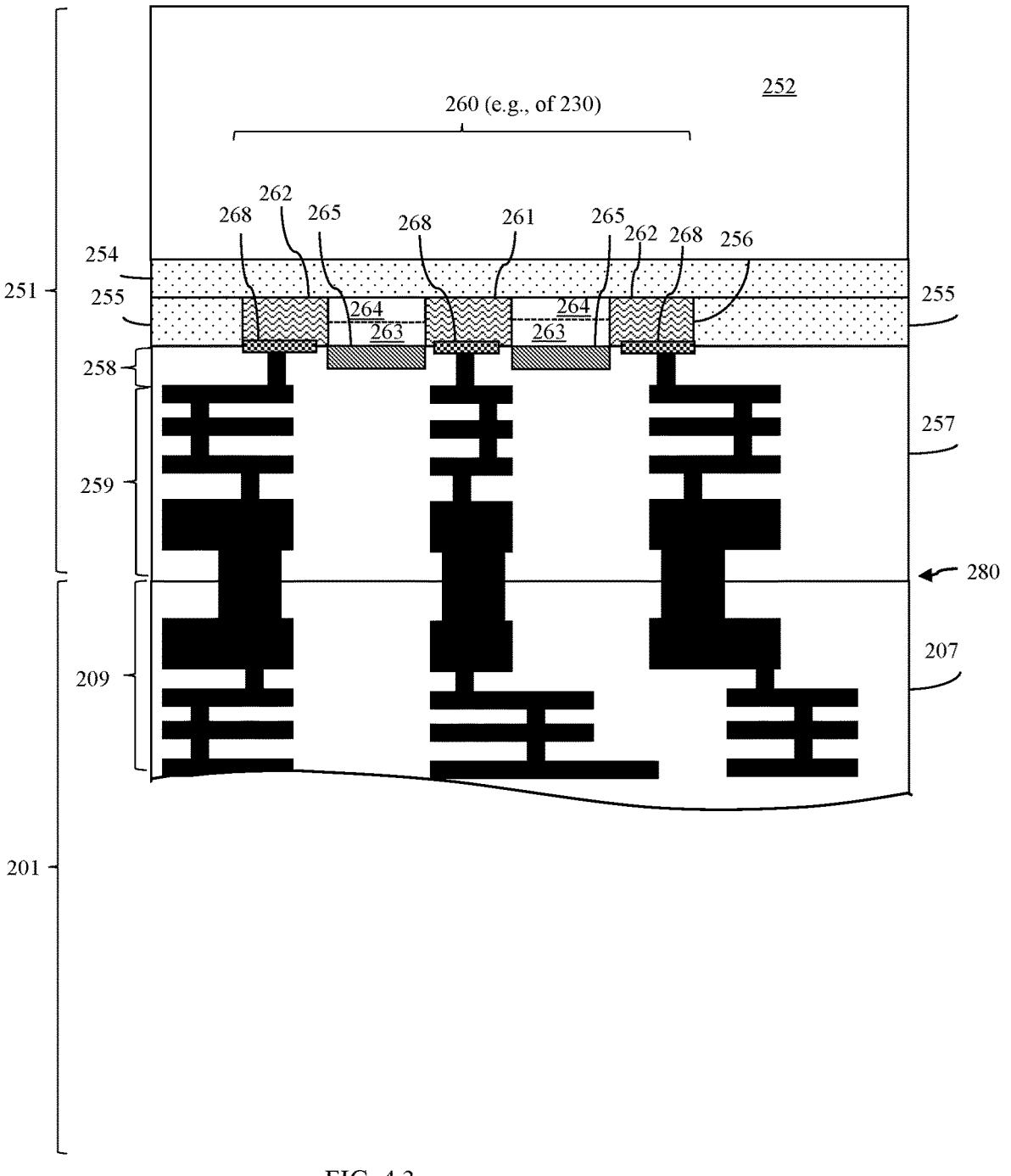
FIG. 4.3

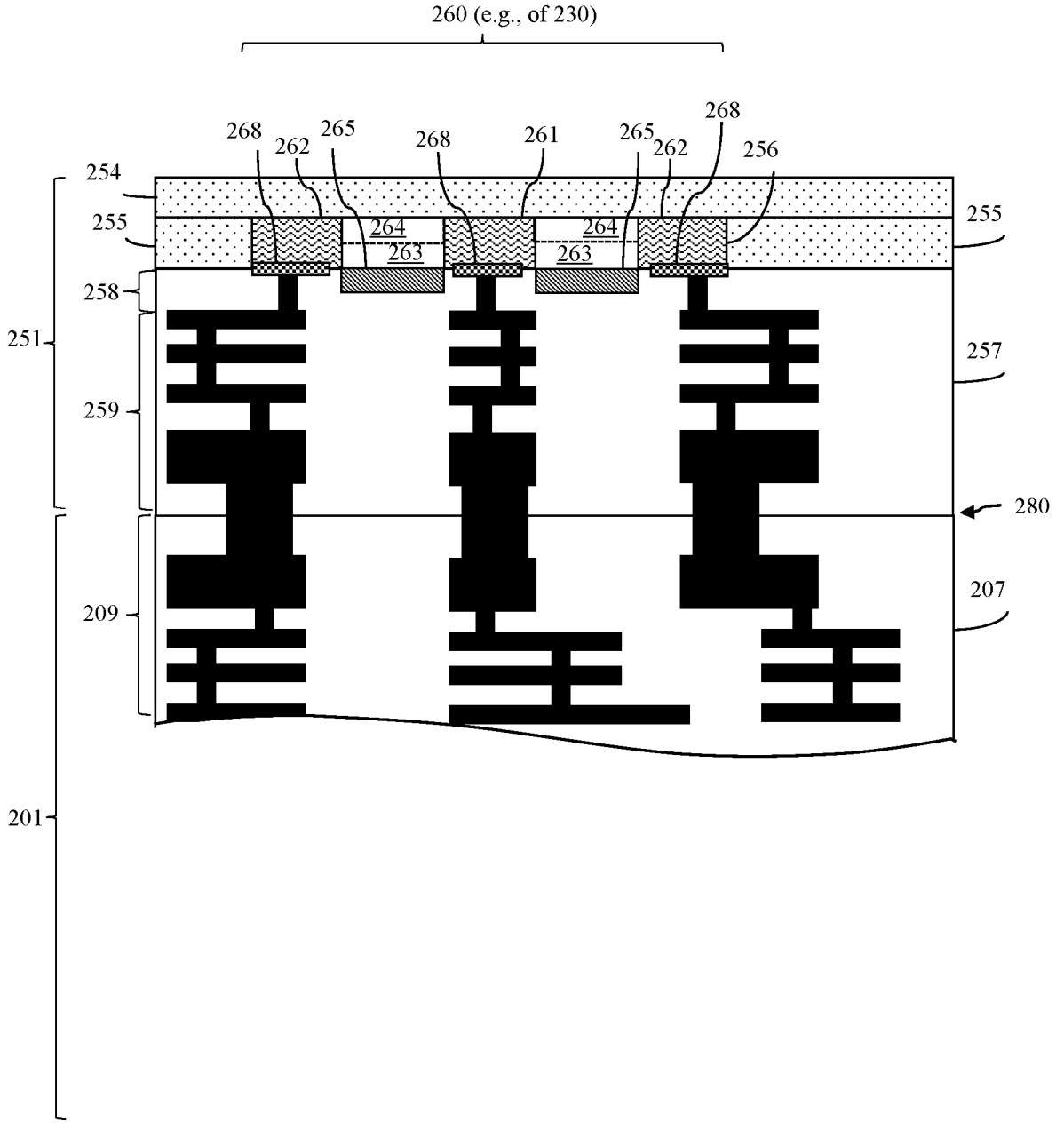
FIG. 4.4

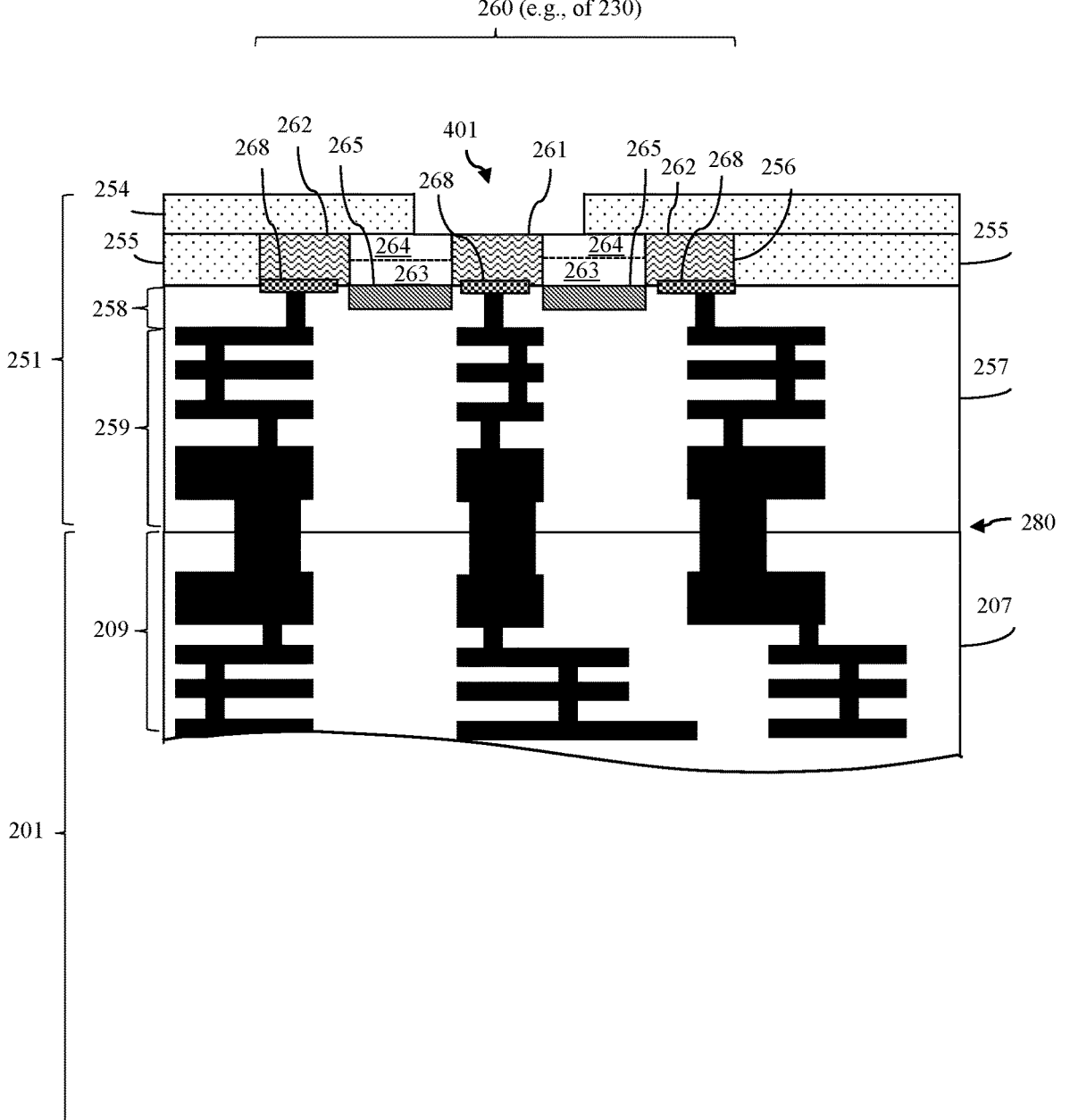
FIG. 4.5

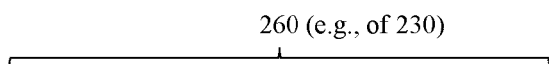
FIG. 4.6

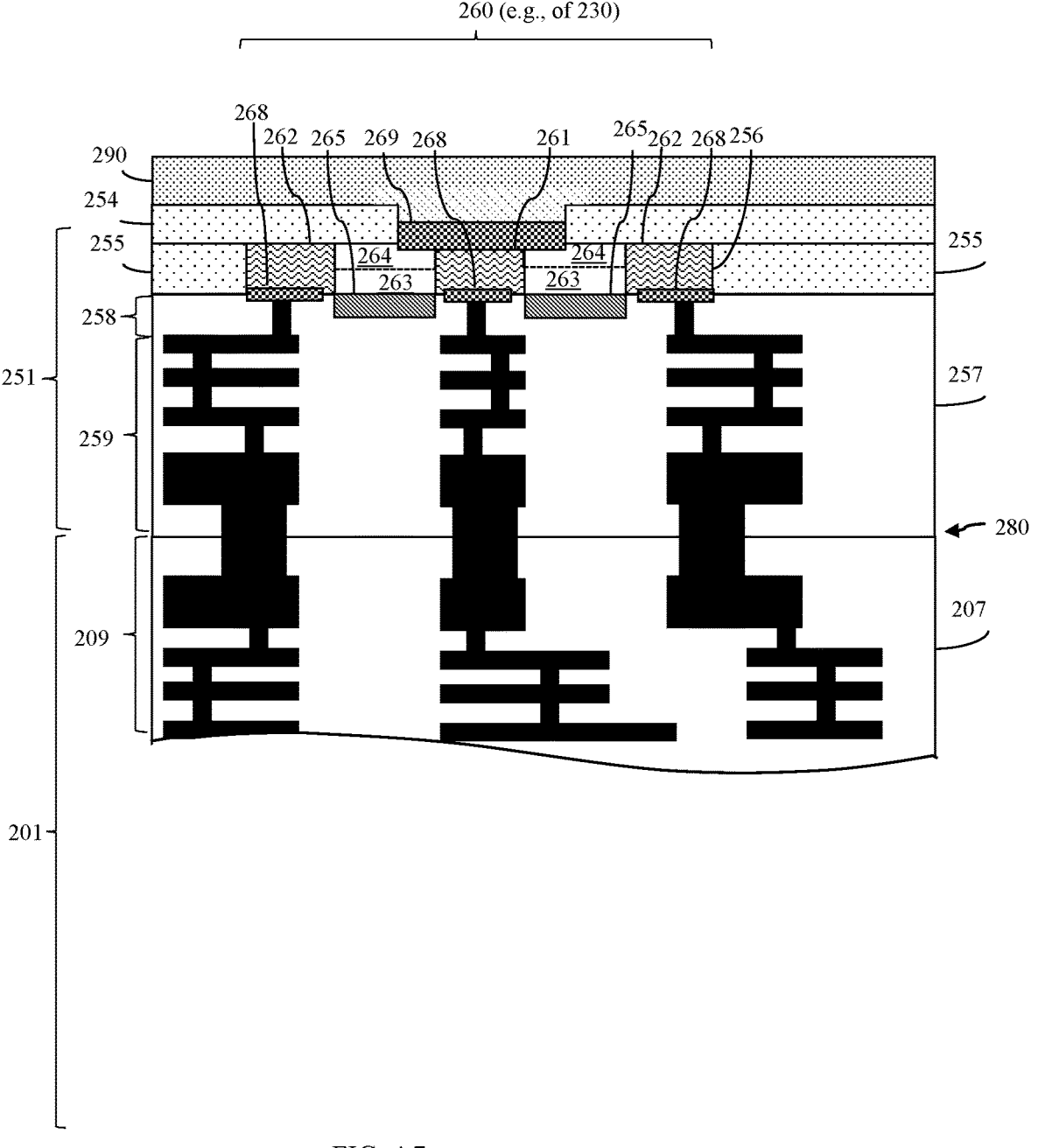
FIG. 4.7

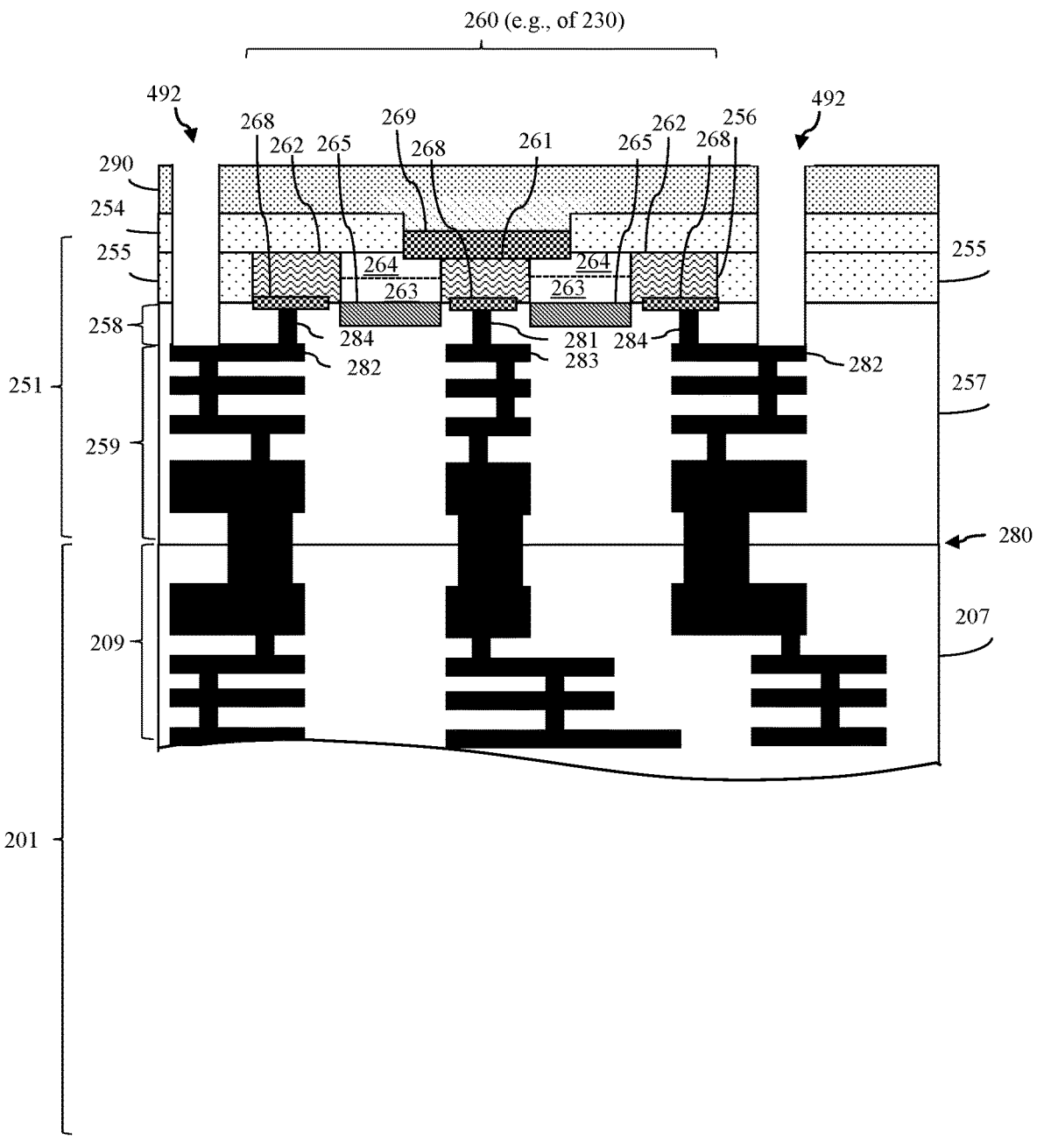
FIG. 4.8

THREE-DIMENSIONAL INTEGRATED CIRCUIT WITH TOP CHIP INCLUDING LOCAL INTERCONNECT FOR BODY-SOURCE COUPLING

BACKGROUND

The present disclosure relates to three-dimensional (3D) integrated circuits (ICs) and, more particularly, a 3DIC structure and method of forming the 3DIC structure.

3DICs can include, for example, at least two chips (e.g., a bottom chip and a top chip) stacked vertically and electrically connected. Such 3DICs reduce two-dimensional (2D) area consumption of a chip package with just a slight increase in chip package thickness. However, the available area for making electrical connections between and within devices on the same chip is also reduced. For example, in the top chip, the available area for achieving body-source electrical coupling may be reduced.

SUMMARY

Disclosed herein are embodiments of an IC structure and, particularly, a 3DIC. In some embodiments, the 3DIC can include a first chip (also referred to herein as a top chip) stacked on a second chip (also referred to herein as a bottom chip). The first chip can include first dielectric material layers adjacent to the second chip and, particularly, adjacent to second dielectric material layers of the second chip. The first chip can further include a first insulator layer and a first transistor between the first dielectric material layers and the first insulator layer. The first transistor can include: a first source region; a first drain region; a first channel region; a first body region on the first channel region, wherein the first channel region and the first body region are positioned laterally between the first source region and the first drain region; and a first gate structure between the first channel region and the first dielectric material layers. The first chip can further include a local interconnect within the first insulator layer immediately adjacent to the first body region and the first source region.

In other embodiments, the 3DIC can similarly include a first chip stacked on a second chip. The first chip can include first dielectric material layers adjacent to the second chip and, particularly, adjacent to second dielectric material layers of the second chip. The first chip can further include a first insulator layer and a first transistor between the first dielectric material layers and the first insulator layer. The first transistor can include: first drain regions; a first source region; first channel regions; and first body regions on the first channel regions, respectively, wherein each first channel region and corresponding first body region are positioned laterally between the first source region and one of the first drain regions; and first gate structures between the first channel regions, respectively, and the first dielectric material layers. The first chip can further include a local interconnect within the first insulator layer immediately adjacent to the first source region and the first body regions.

Also disclosed herein are embodiments of a method of forming the above-described semiconductor structures. In some embodiments, the method can include forming a first chip, forming a second chip and stacking the first chip on the second chip. In the resulting stacked structure, the first chip can include first dielectric material layers adjacent to the second chip and, particularly, adjacent to second dielectric material layers of the second chip. The first chip can further include a first insulator layer and a first transistor between the first dielectric material layers and the first insulator layer. The first transistor can include: a first source region; a first drain region; a first channel region; a first body region on the first channel region, wherein the first channel region and the first body region are positioned laterally between the first source region and the first drain region; and a first gate structure between the first channel region and the first dielectric material layers. The method can further include forming a trench that extends through the first insulator layer to the first body region (i.e., opposite the first gate structure) and forming a local interconnect within the trench immediately adjacent to the first source region and the first body region.

BRIEF DESCRIPTION OF THE DRAWINGS

The present disclosure will be better understood from the following detailed description with reference to the drawings, which are not necessarily drawn to scale and in which:

FIGS. 3.1-3.8 are cross-section diagrams illustrating partially completed semiconductor structures formed according to an embodiment of a method of forming the semiconductor structure of FIGS. 1A-1B; and FIGS. 4.1-4.8 are cross-section diagrams illustrating partially completed semiconductor structures formed according to an embodiment of a method of forming the semiconductor structure of FIGS. 2A-2B.

DETAILED DESCRIPTION

Figure 1A:
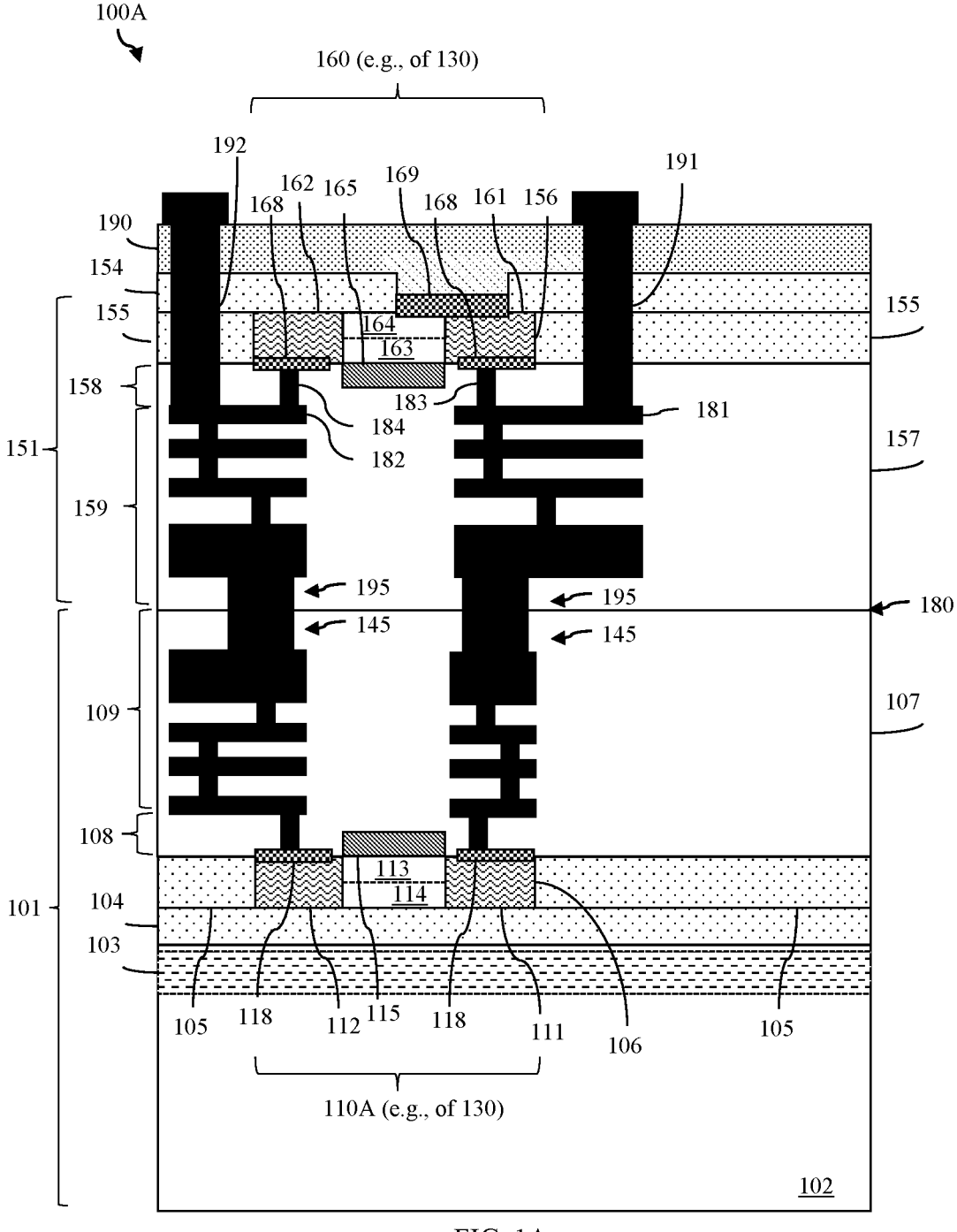
FIGS. 1A and 1B are cross-section diagrams illustrating embodiments of a 3DIC structure.

As mentioned above, 3DICs have been developed that include, for example, at least two chips (e.g., a bottom chip and a top chip) stacked vertically and electrically connected. Components of a given IC design are divided between the two chips. For example, transistors of different devices can be on the same or different chips. Transistors of the same multi-transistor device can also be on the same or different chips. In multi-gate finger transistors, the gate structures (also referred to herein as the gate fingers) can also be on the same or different chips. The top and bottom chips can each have back-end-of-the-line (BEOL) metal levels. The top chip can be flipped relative to the bottom chip and the outermost BEOL surfaces of the two chips can be bonded together. Electrical pathways through the BEOL metal levels on both chips can provide electrical connections between devices on the same chip and between devices on different chips. Such 3DICs reduce two-dimensional (2D) area consumption of a chip package with just a slight increase in chip package thickness. However, the available area for making electrical connections between and within devices on the same chip is also reduced. For example, in the top chip, the available area for achieving body-source electrical coupling may be reduced.

In view of the foregoing, disclosed herein are embodiments of a 3DIC structure including a first chip (also referred to herein as a top chip) flipped relative to and stacked on a second chip (also referred to herein as a bottom chip). The first chip can include first dielectric material layers (including, for example, middle of the line (MOL) dielectric material layer(s) and back end of the line (BEOL) dielectric material layers) with an outermost surface of the first dielectric material layers being bonded to an outermost surface of the second dielectric material layers of the second chip. The first chip can further include a first transistor (e.g., a metal oxide semiconductor field effect transistor (MOS-FET)), which is separated from the second chip by the first dielectric material layers. In some embodiments, the first transistor can include a first active device region and a first gate structure. The first active device region can include first source and drain regions and a first body region on a first channel region positioned laterally between the first source and drain regions. The first gate structure can be adjacent to and between the first channel region and the first dielectric material layers. In other embodiments, the first transistor can include a first active device region and multiple gate structures (also referred to herein as gate fingers). The first active device region can include: a first source region positioned laterally between first drain regions and, positioned laterally between the first source region and each first drain region, and a first body region on a first channel region. The first gate structures can be adjacent to and between the first channel regions and the first dielectric material layers. In any case, the first chip can further include a first insulator layer on the first active device region opposite the first dielectric material layers and the first gate structure(s). A trench can extend through the first insulator layer to the first source region and to first body region(s) positioned laterally adjacent thereto. The first source region and the first body region(s) can further be electrically connected by a local interconnect (e.g., a metal silicide layer) at the bottom of the trench. Also disclosed herein are method embodiments for forming the disclosed 3DIC structures.

Figure 1B:
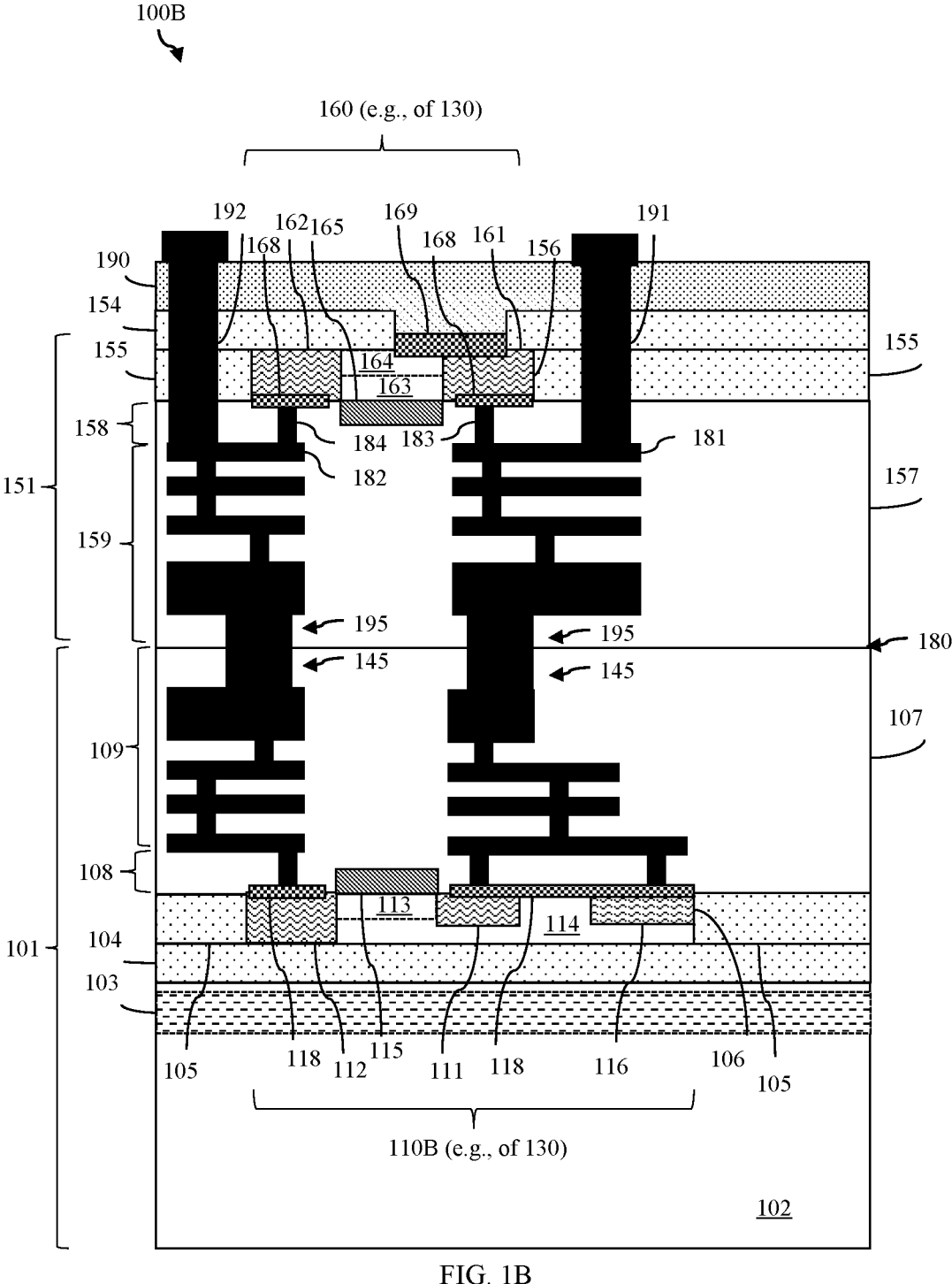
Figure 2A:
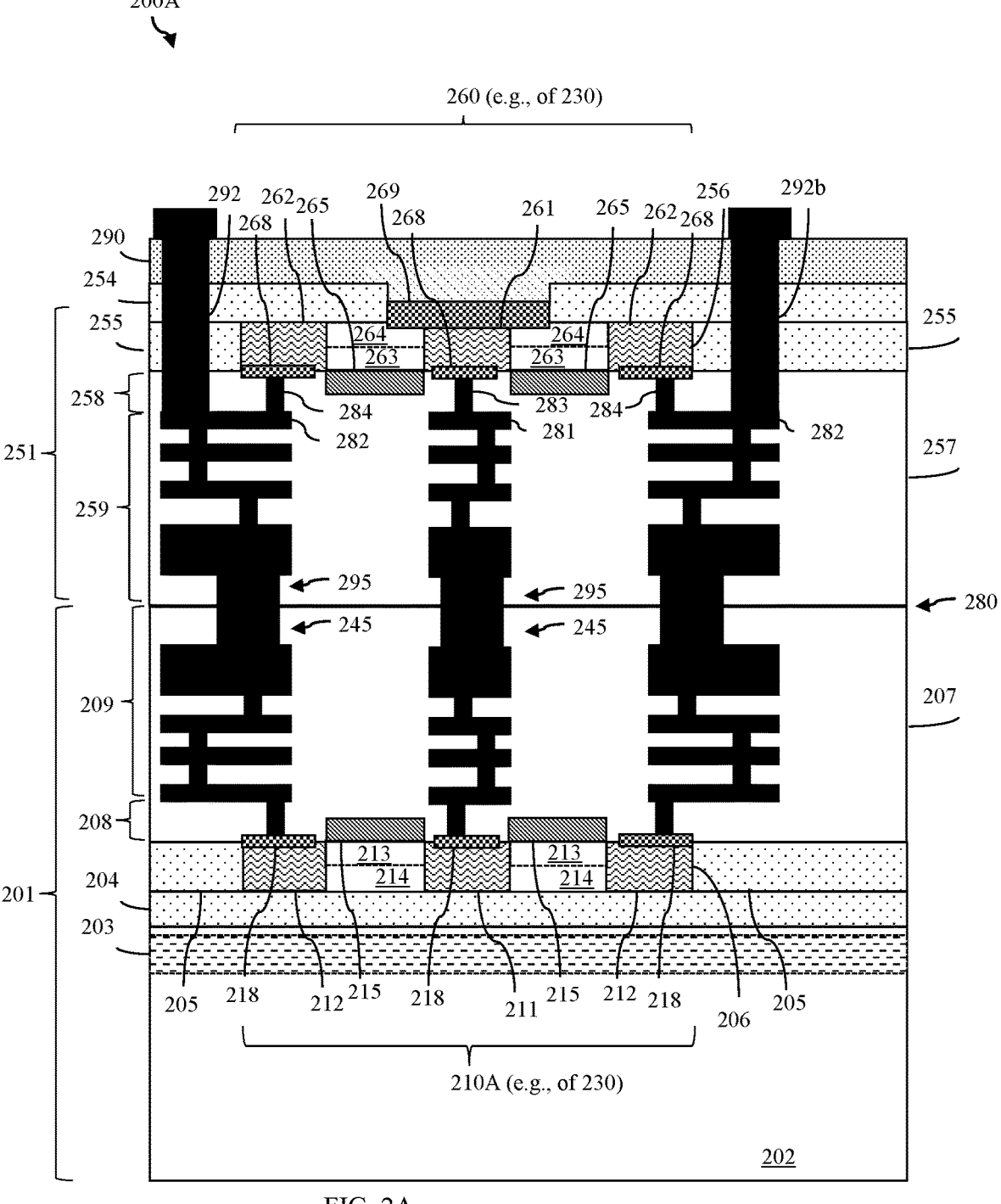
FIGS. 2A and 2B are cross-section diagrams illustrating additional embodiments of a 3DIC structure.
Figure 2B:
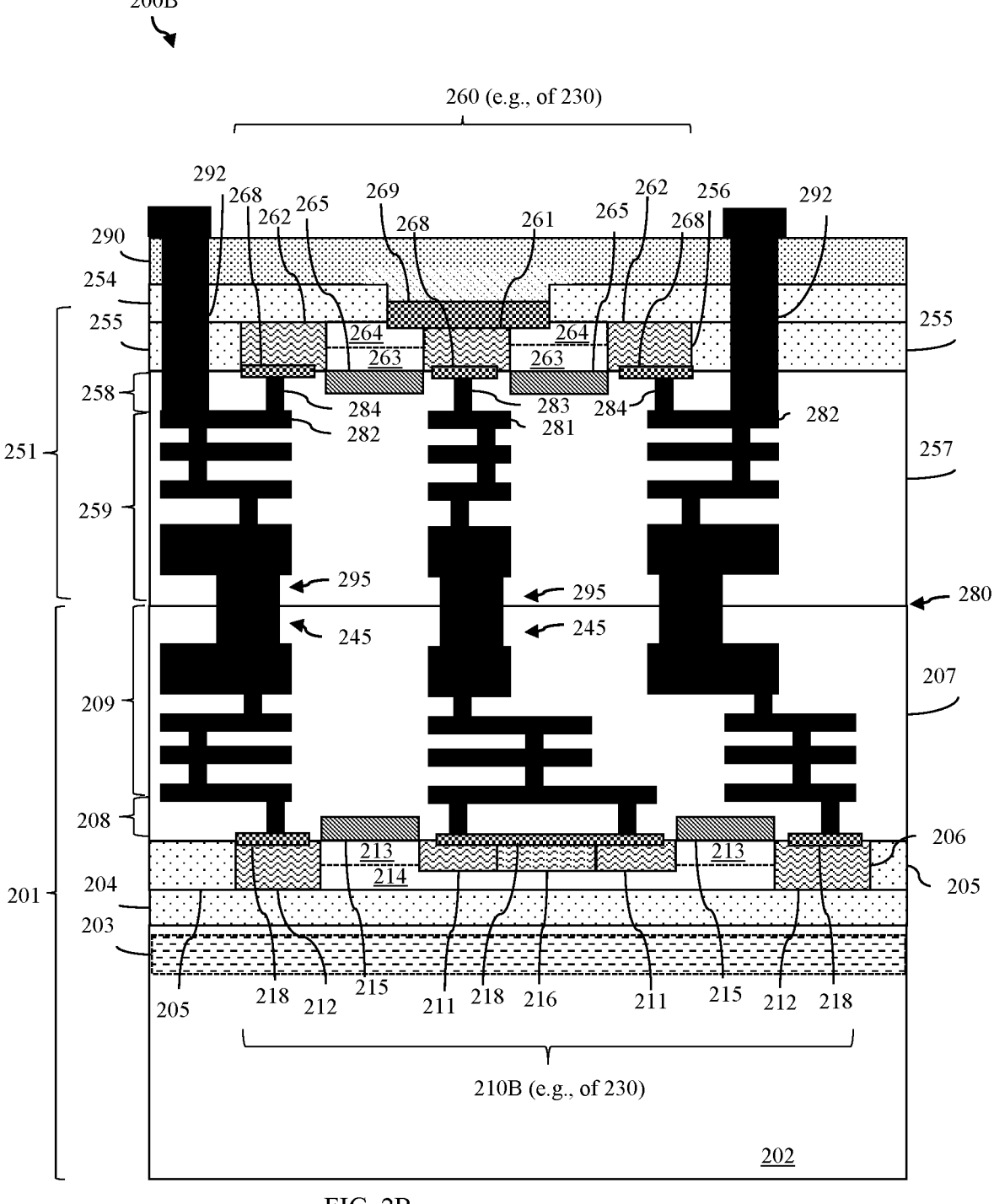

FIGS. 1A and 1B are cross-section diagrams illustrating embodiments of a 3DIC structure 100A and 100B, respectively. FIGS. 2A and 2B are cross-section diagrams illustrating additional embodiments of a 3DIC structure 200A and 200B, respectively. Referring to FIGS. 1A-1B and 2A-2B unless otherwise noted, in each of these embodiments, the 3DIC structure 100A-100B, 200A-200B can include a first chip 151, 251 (also referred to herein as a top chip) and a second chip 101, 201 (also referred to herein as a bottom chip). The first chip 151, 251 can be flipped relative to the second chip 101, 201 and outermost surfaces of BEOL dielectric material layers of the two chips can be bonded together or otherwise connected (see bonded surfaces 180, 280), as discussed in greater detail below.

More particularly, the first chip 151, 251 can include multiple first dielectric material layers 157, 257. As discussed in greater detail below, the first dielectric material layers 157, 257 can include one or more first dielectric material layers in a first MOL region 158, 258 adjacent to front end of the line (FEOL) first device(s). The first MOL region 158, 258 can further include first contacts extending therethrough to the FEOL first device(s). The first dielectric material layers 157, 257 can further include multiple first dielectric material layers in a first BEOL region 159, 259 adjacent to the first MOL region 158, 258. The first BEOL region 159, 259 can further include first conductive wires and vias required for electrical pathways therein. The second chip 101, 201 can include multiple second dielectric material layers 107, 207. As discussed in greater detail below, the second dielectric material layers 107, 207 can include one or more second dielectric material layers in a second MOL region 108, 208 adjacent to FEOL second device(s). The second MOL region 108, 208 can further include second contacts extending therethrough to the FEOL second device(s). The second dielectric material layers 107, 207 can further include multiple second dielectric material layers in a second BEOL region 109, 209 adjacent to the second MOL region 108, 208. The second BEOL region 109, 209 can further include second conductive wires and vias required for electrical pathways therein.

On each chip, the MOL dielectric material layers can optionally include a thin conformal etch stop layer (e.g., a thin conformal silicon nitride (SiN) layer or one or more conformal layers of some other suitable etch stop material) covering the FEOL device(s). The MOL dielectric material layers can also include a blanket dielectric layer on the etch stop layer. The blanket dielectric layer can be a layer of interlayer dielectric (ILD) material. The ILD material can include, for example, silicon dioxide ($SiO_2$) or any other suitable ILD material, such as borophosphosilicate glass (BPSG), phosphosilicate glass (PSG), etc. MOL contacts can extend through the MOL dielectric material layers to terminal(s) of FEOL device(s). The BEOL dielectric material layers can be stacked on the MOL dielectric material layer(s) and can include relatively thick ILD material layers for the BEOL metal and via levels within the BEOL region and, optionally, relatively thin dielectric layers (e.g., etch stop layers) therebetween. The first chip 151, 251 can be flipped relative to the second chip 101, 201, stacked thereon, and a first outermost BEOL dielectric material layer of the first chip 151, 251 can be bonded to or otherwise attached to a second outermost BEOL dielectric material layer of the second chip 101, 201 (see bonded surfaces 180, 280).

The first chip 151, 251 can further include a first FEOL region. The first FEOL region can include a first semiconductor layer adjacent to the first dielectric material layers 157, 257 and, particularly, adjacent to an innermost surface of the first dielectric material layers distal to the second chip 101, 201. The first semiconductor layer can include a monocrystalline silicon (Si) layer or a monocrystalline layer of any other suitable semiconductor material. The FEOL region can further include one or more FEOL first devices formed using the first semiconductor layer including, but not limited to, a first transistor 160, 260 (e.g., a metal oxide semiconductor field effect transistor (MOSFET)).

The first transistor 160, 260 can include a first active device region 156, 256 in a portion of the first semiconductor layer. Boundaries of the first active device region 156, 256 can, for example, be defined by first isolation regions 155, 255. First isolation regions 155, 255 can be first shallow trench isolation (STI) regions, where trenches extend through the first semiconductor layer, and are filled with one or more layers of isolation material. Alternatively, the first isolation regions 155, 255 could include portions of the first semiconductor layer doped or otherwise processed to isolate the first active device region 156, 256.

In some embodiments, as illustrated in FIGS. 1A and 1B, the first active device region 156 can include a first source region 161 and a first drain region 162 positioned laterally adjacent but physically separated from first source region 161. The first active device region 156 can further include a first channel region 163 within the space between the first source and drain regions 161-162 (i.e., positioned laterally between the first source region 161 and the first drain region 162) and further proximal to the first dielectric material layers 157. The first active device region 156 can also include a first body region 164 within the space between the first source and drain regions 161-162 distal to the first dielectric material layers 157 and, more particularly, above the first channel region 163, as oriented in the figures. In these embodiments, the first transistor 160 can further include a first gate structure 165 adjacent to the first channel region 163. Specifically, the first gate structure 165 can be positioned between the innermost surface of the first dielectric material layers 157 and the first active device region 156 at the first channel region 163.

In other embodiments, as illustrated in FIGS. 2A and 2B, the first active device region 256 can include alternating first source and drain regions separated by spaces. The alternating first source and drain regions can include at least a first source region 261 and two first drain regions 262 adjacent to, but separated from, opposing sides of the first source region 261. The first active device region 256 can further include first channel regions 263. Each first channel region 263 can be within a space between the first source region 261 and a corresponding one of the first drain regions 262 (i.e., positioned laterally between the first source region 261 and one of the first drain regions 262) and further proximal to the first dielectric material layers 257. The first active device region 256 can also include first body regions 264. Each first body region 264 can be between the first source region 261 and a corresponding one of the first drain regions 262 distal to the first dielectric material layers 257 and, more particularly, above a first channel region 263, as oriented in the figures. In these embodiments, the first transistor 260 can further include first gate structures 265 (also referred to herein as first gate fingers) adjacent to the first channel regions 263. Specifically, each first gate structure 265 can be positioned between the first dielectric material layers 257 and the first active device region 156 at a corresponding one of the first channel regions 263. The first gate structures 265 can be electrically connected. For example, an additional first gate structure (not shown) can be on an adjacent isolation region and can be perpendicular to and continuous with the first gate structures 265. Alternatively, first gate structures 265 can be electrically connected by any other suitable means such that the first gate structures 265 are concurrently biasable. In any case, the first gate structure(s) 165, 265 can be electrically isolated from the first source region 161, 261 and the first drain region(s) 162, 262 by first gate sidewall spacers (not shown).

Referring again to FIGS. 1A-1B and FIGS. 2A-2B, optionally, first metal silicide layers 168, 268 can be on surfaces of the first source region 161, 261 and the first drain region(s) 162, 262 and, thus, stacked between the first dielectric material layers 157, 257 and the first active device region 156, 256 and positioned laterally adjacent to the first gate sidewall spacers of the first gate structure(s) 165, 265. Additionally, the first source region 161, 261 and the adjacent first body region(s) 164, 264 can be electrically coupled (i.e., electrically connected) by a local interconnect 169, 269 on the surface of the first active device region 156, 256 opposite the first gate structure(s) 165, 265.

Specifically, the first chip 151, 251 can further include a first insulator layer 154, 254 (also referred to herein as a first buried insulator layer or a first buried oxide layer) on the first semiconductor layer (and, thus, on the first active device region 156, 256 of the first transistor 160, 260) and further extending laterally onto the first isolation regions 155, 255 opposite the first dielectric material layers 157 and the first gate structure(s) 165, 265. A trench can extend completely through the first insulator layer 154, 254 to the first active device region 156, 256 and can specifically be patterned so as to expose surfaces of the first source region 161, 261 and the adjacent first body region(s) 164, 264 without further exposing surfaces of the first drain region(s) 162, 262. The first transistor 160, 260 can further include a local interconnect 169, 269 within and covering the bottom surface of the trench so that the first source region 161, 261 and the adjacent first body region(s) 164, 264 are electrically coupled. In some embodiments, the local interconnect 169, 269 can be a metal silicide layer including the same metal silicide material as the first metal silicide layers 168, 268 or a different metal silicide material.

The first chip 151, 251 can further include an additional first insulator layer 190, 290. The additional first insulator layer 190, 290 can be on the first insulator layer 154, 254 and can further fill the remaining portion of the trench over the local interconnect 169, 269.

The first chip 151, 251 can further include multiple through oxide vias (TOVs), as well as the first contacts within the first MOL region 158, 258, and first conductive wires and vias within the first BEOL region 159, 259.

Referring specifically to FIGS. 1A and 1B, the TOVs of the first chip 151 can include a source via 191 and a drain via 192. The source via 191 and drain via 192 can each extend through the additional first insulator layer 190, through the first insulator layer 154, through first isolation regions 155, and into the first dielectric material layers 157 and, particularly, through the first MOL region 158. The source via 191 and drain via 192 can land on two discrete first conductive wires 181 and 182, respectively, within the first metal level (M1) of the first BEOL metal levels of the first BEOL region 159. Two first contacts 183 and 184 can extend from the two first conductive wires 181 and 182 through the first dielectric layers of the first MOL region 158 to the first source region 161 and the first drain region 162, respectively. As illustrated, additional first conductive wires and vias within metal levels M1-Mx of the first BEOL region 159 can provide electrical pathways from the first conductive wires 181 and 182 (and, thereby from the source via 191 and drain via 192, respectively) to the bonded surfaces 180. Although not shown, it should be understood that first contacts in the first MOL region 158 and first conductive wires and vias within the first BEOL region 159 can also provide an electrical pathway to the first gate structure 165.

Referring specifically to FIGS. 2A and 2B, the TOVs of the first chip 251 can include a source via (not shown) and drain via 292. The source via and drain vias 292 can extend through the additional first insulator layer 290, through the first insulator layer 254, through first isolation regions 255, and into the first dielectric material layers 257 and, particularly, through the first MOL region 258. The source via can land on a first conductive wire 281 and the drain vias 292 can land on two discrete first conductive wires 282, for example, within M1 of the first BEOL region 259. It should be understood that the source via can be placed at some location between but offset from drain vias 292, such that it is not within the same vertical plane as the drain vias. A first contact 283 can extend from the first conductive wire 281 through the first dielectric material layer(s) of the first MOL region 258 to the first source region 261. First contacts 284 can extend from the first conductive wires 282 through the first dielectric material layer(s) of the first MOL region 258 to the first drain regions 262, respectively. As illustrated, additional first conductive wires and vias within the first BEOL region 259 can provide electrical pathways from the first conductive wire 281 and from each first conductive wire 282 (and, thereby from the source via and each drain via 292, respectively) to the bonded surfaces 280. Although not shown, it should be understood that first contact(s) within the first MOL region 258 and first conductive wires and vias within the first BEOL region 259 can also provide electrical pathway(s) to the first gate structure(s).

Referring again to FIGS. 1A-1B and 2A-2B, the first chip 151, 251 can further include input/output pads on the additional first insulator layer 190, 290 aligned above the multiple contacts. Additional features of the first chip 151, 251 can include, but are not limited to, a passivation layer on the additional first insulator layer 190, 290. Electrical connections to the input/output pads can be made through openings that extend through the passivation layer to the input/output pads.

The second chip 101, 201 can include a second semiconductor substrate 102, 202. The second chip 101, 201 can further include a second insulator layer 104, 204 (also referred to herein as a second buried insulator layer or a second buried oxide layer) above and immediately adjacent to the semiconductor substrate 102, 202. Optionally, the semiconductor substrate 102, 202 can include a high resistance region 103, 203 (also referred to herein as a trap-rich region) adjacent to the second insulator layer 104, 204. For example, the high resistance region 103, 203 can be a defect region within the semiconductor substrate. This defect region can be polycrystalline or amorphous in structure and can include imperfections in the regular spacing of atoms that make up the semiconductor material. These imperfections form traps and, specifically, locations within the semiconductor substrate that restrict movement of charge carriers (i.e., electrons and holes) so that this defect region is referred to as being a trap-rich region. The presence of these imperfections or traps increases resistance so that this defect region is also referred to as a high resistance region. As discussed in greater detail below regarding the method embodiments, an exemplary technique for forming such a high resistance region 103, 203 within a semiconductor substrate 101, 202 can include implantation of an inert dopant to modify the crystalline structure (e.g., to convert it to an amorphous structure). For purposes of this disclosure, an inert dopant refers to a dopant species that is generally not considered to be chemically reactive (i.e., that is neutral) at least with respect to the particular semiconductor material of the semiconductor substrate, that does not completely prevent recrystallization of the doped region during a subsequent rapid thermal anneal process (RTA) (e.g., to create poly and/or monocrystalline region(s)), and that does not significantly impact the electrical properties of the resulting poly and/or monocrystalline region(s). Such inert dopants include, but are not limited to, inert gases (also referred to as noble gases) (e.g., argon, xenon, helium, neon, krypton, radon, etc.), silicon, or any other suitable inert dopant. The inert dopant implantation process is followed by a recrystallization anneal during which the amorphized portion begins to recrystallize from the top down and from the bottom up and, as a result, the defect region is formed. Thus, if the semiconductor substrate 102, 202 includes a high resistance region 103, 203, the inert dopant will be present below, within, and above the high resistance region 103, 203.

The second chip 101, 201 can further include a second FEOL region 208. The second FEOL region can include a second semiconductor layer on the second insulator layer 104, 204. The second semiconductor layer can include a monocrystalline silicon (Si) layer or a monocrystalline layer of any other suitable semiconductor material. The FEOL region can further include one or more FEOL second devices formed using the second semiconductor layer Optionally, the second device(s) can include any of MOSFET(s), bipolar junction transistor(s) (BJT(s)), diode(s), passive device(s) (e.g., resistors) or any other type of semiconductor device. Optionally, one or more of the FEOL second devices could be electrically connected to the first transistor 160, 260 via electrical pathways established in the first MOL and BEOL regions and the second MOL and BEOL regions.

In some embodiments, a FEOL second device on the second chip 101, 201 could be a second transistor (e.g., a MOSFET). For purposes of illustration, differently configured MOSFETs 110A, 110B, 210A, and 210B, respectively, are shown in the 3DIC structures of 100A of FIG. 1A, 100B of FIG. 1B, 200A of FIG. 2A, and 200B of FIG. 2B, respectively. However, the second chip 101, 201 of any of the disclosed embodiments could include any of these differently configured second transistors 110A, 110B, 210A, or 210B.

The second transistor 110A, 110B, 210A, 210B can include a second active device region 106, 206). Boundaries of the second active device region 106, 206 can, for example, be defined by second isolation regions 105, 205. Second isolation regions 105, 205 can be second STI regions (e.g., trenches, which extend through the second semiconductor layer, and which are filled with one or more layers of isolation material). Alternatively, the second isolation regions 105, 205 could include portions of the second semiconductor layer doped or otherwise processed to isolate the second active device region 106, 206.

Referring specifically to FIG. 1A, the second transistor 110A can include, within the second active device region 106, a second source region 111, a second drain region 112 and, positioned laterally between the second source region 111 and the second drain region 112, a second body region 114 and a second channel region 113 above the second body region 114. The second transistor 110A can further include a second gate structure 115 on the second active device region 106 adjacent to the second channel region 113. Optionally, the second transistor 110A can further include second metal silicide layers 118 on the second source region 111, on the second drain region 112 and, optionally, on the second gate structure 115 (not shown). Second gate sidewall spacers (not shown) can electrically isolate the second gate structure 115 from the second source region 111, the second drain region 112 and any second metal silicide layers 118 thereon. In the second transistor 110A, the second body region 114 is not contacted for purposes of body biasing such that the second transistor 110A is a floating body (FB) single finger MOSFET.

Referring specifically to FIG. 1B, the second transistor 110B can include, within the second active device region 106, a second source region 111, a second drain region 112, and a second channel region 113 positioned laterally between the second source region 111 and the second drain region 112. Also, within the second active device region 106, the second transistor 110B can include a body contact region 116 (e.g., adjacent to the second source region 111) and a second body region 114 immediately adjacent to the body contact region 116 and further extending laterally below and immediately adjacent to the second source region 111 and the second channel region 113. In some embodiments, the second drain region 112 can extend deeper into the second active device region 106 than the second source region 111 and the body contact region 116. For example, the second drain region 112 can extend from the top surface of the second active device region 106 to the top surface of the second insulator layer 104, as illustrated. The second transistor 110B can further include a second gate structure 115 on the second active device region 106 adjacent to the second channel region 113. Optionally, the second transistor 110B can further include second metal silicide layers 118 on the second source region 111, on the second drain region 112, on the body contact region 116, and, optionally, on the second gate structure 115 (not shown). Second gate sidewall spacers (not shown) can electrically isolate the second gate structure 115 from the second source region 111, the second drain region 112 and any second metal silicide layers 118 thereon. In the second transistor 110B, the second body region 114 can be contacted (via body contact region 116) for purposes of body biasing such that the second transistor 110B is a body-contacted single finger MOSFET. Optionally, in the second transistor 110B, the second source region 111 and body contact region 116 can be electrically connected (e.g., via a local interconnect, such as a second metal silicide layer 118 that extends laterally across the source and body regions and/or via second contacts in the second MOL region 108 and second conductive wires and/or vias in the second BEOL region 109).

Referring to FIG. 2A, the second transistor 210A can include, within the second active device region 206, alternating source and drain regions. For example, the second transistor 210A can include at least a second source region 211 positioned laterally between and physically separated from two second drain regions 212. The second transistor 210A can further include second body regions 214 and second channel regions 213. Specifically, between the second source region 211 and each drain region 212, the second transistor 210A can include a second body region 214 and a second channel region 213 above the second body region 214. The second transistor 210A can further include multiple second gate structures 215 (also referred to herein as second gate fingers) on the second active device region 206 adjacent to the second channel regions 213, respectively. The second gate structures 215 can be electrically connected. For example, an additional second gate structure (not shown) can be on an adjacent isolation region and can be perpendicular to and continuous with the second gate structures 215. Alternatively, the second gate structures 215 can be electrically connected by any other suitable means. Optionally, the second transistor 210A can further include second metal silicide layers 218 on the second source region 211, on each second drain region 212 and, optionally, on the second gate structures 125 (not shown). Second gate sidewall spacers (not shown) can electrically isolate the second gate structures 215 from the second source region 211, the second drain regions 212 and any second metal silicide layers 218 thereon. In the second transistor 210A, the second body regions 214 are not contacted for purposes of body biasing such that the second transistor 210A is a FB multi-finger MOSFET.

Referring to FIG. 2B, the second transistor 210B can include, within the second active device region 206, alternating second source and drain regions. For example, the second transistor 210B can include at least a second source region 211 positioned laterally between and physically separated from two second drain regions 212. The second transistor 210B can further include second channel regions 213 and each second channel region 213 can be positioned laterally between the second source region 211 and one of the second drain regions 212. Within the second active device region 206, the second transistor 210B can further include a body contact region 216. Optionally, the body contact region 216 can be adjacent to the second source region 211, such as laterally surrounded by the second source region 211. Within the second active device region 206, the second transistor 210B can further include a second body region 214 immediately adjacent to the body contact region 216 and further extending laterally below and immediately adjacent to the second source region 211 and the second channel regions 213. In some embodiments, the second drain regions 212 can extend deeper into the second active device region 206 than the second source region 211 and the body contact region 216. For example, the second drain regions 212 can extend from the top surface of the second active device region 206 to the top surface of the second insulator layer 204, as illustrated. The second transistor 210B can further include multiple second gate structures 215 (also referred to herein as second gate fingers) on the second active device region 206 adjacent to the second channel regions 213, respectively. The second gate structures 215 can be electrically connected. For example, an additional second gate structure (not shown) can be on an adjacent isolation region and can be perpendicular to and continuous with the second gate structures 215. Alternatively, the second gate structures 215 can be electrically connected by any other suitable means. Optionally, the second transistor 210B can further include second metal silicide layers 218 on the second source region 211, on each second drain region 212 and, optionally, on the second gate structures 215 (not shown). Second gate sidewall spacers (not shown) can electrically isolate the second gate structures 215 from the second source region 211, the second drain regions 212 and any second metal silicide layers 218 thereon. In the second transistor 210B, second body region 214 can be contacted through the body contact region 216 for purposes of body biasing such that the second transistor 210B is a body-contacted multi-gate finger MOSFET. Optionally, the second source region 211 and body contact region 216 within the second transistor 210B can be electrically connected (e.g., via a local interconnect, such as a second metal silicide layer 218 that extends across the source and body contact regions and/or via second contacts in the second MOL region 208 and second conductive wires and/or vias within the second BEOL region 209).

Referring again to FIGS. 1A-1B, 2A-2B, as mentioned above, the second chip 101, 201 can include second dielectric material layers 107, 207. The second dielectric material layers 107, 207 can include second dielectric material layer(s) in the second MOL region 108, 208 and second dielectric material layers in the second BEOL region 109, 209. The second chip 101, 201 can further include second contacts that extend through the second MOL region 108, 208 to FEOL second devices. For example, the second chip 101, 201 can include second contacts that extend through the second MOL region 108, 208 to the second source region 111, 211, to the second drain region(s) 112, 212, and to the second gate structure(s) (not shown). Second conductive wires and vias within the second BEOL region 109, 209 can provide discrete electrical pathways from second contacts on the second source region 111, 211, the second drain region(s) 112, 212 and the second gate structure(s) 115, 215 (not shown) to the bonded surfaces 180, 280.

As mentioned above, the first chip 151, 251 can be flipped relative to and stacked on the second chip 101, 201. Optionally, the first transistor 160, 260 in the first chip 151, 251 can be aligned above the second transistor 110A or 110B, 210A or 210B in the second chip 101, 201. Optionally, the first transistor 160, 260 and the second transistor 110A or 110B, 210A or 2100B can further be electrically connected via electrical pathways extending through the second dielectric material layers 107, 207 and the first dielectric material layers 157, 257. For example, at the bonded surfaces 180, 280, one or more first vias 195, 295 (which extend through the last metal level (Mx) in the first BEOL region 159, 259 of the first chip 151, 251 and which is/are end(s) to electrical pathway(s) to the first source region 161, 261, to the first drain region(s) 162, 262 and/or to the first gate structure(s) 165, 265 (not shown)) can be aligned and bonded to one or more second vias 145, 245 (which extend through the last metal level (Mx) in the second BEOL region 109, 209 of the second chip 101, 201 and which is/are end(s) to electrical pathway(s) to the second source region 111, 211, to the second drain region(s) 112, 212, and/or to the second gate structure(s) 115, 215 (not shown)). In some embodiments, such electrical pathways can be established to form a circuit 130, 230 including the first transistor 160, 260 on the first chip 151, 251 and the second transistor 110A or 110B, 210A or 210B on the second chip 101, 201 electrically connected in parallel, as illustrated, or alternatively in series.

Referring to FIGS. 3.1-3.8 and 4.1-4.8, also disclosed herein are method embodiments for forming the 3DIC structures described above and illustrated in FIGS. 1A-1B and FIGS. 2A-2B, respectively.

The methods can include forming a first chip (e.g., see first chip 151 in FIG. 3.1 and first chip 251 in FIG. 4.1). Formation of the first chip 151, 251 can begin with a first semiconductor-on-insulator structure. The first semiconductor-on-insulator structure can be, for example, a silicon-on-insulator (SOI) structure including: a first semiconductor substrate 152, 252 (also referred to herein as a sacrificial semiconductor substrate); a first insulator layer 154, 254 on the first semiconductor substrate 152, 252; and a first semiconductor layer on the first insulator layer 154, 254. FEOL first devices, including at least a first transistor 160, 260, can be formed using the first semiconductor layer. For example, the first isolation regions 155, 255 can be formed in the first semiconductor layer to define a first active device region 156, 256. A first transistor 160, 260 can be formed using the first active device region 156, 256. For example, first gate structure(s) 165, 265 (with gate sidewall spacers) can be formed on the first active device region 156, 256 adjacent to corresponding first channel region(s) 163, 263 (which is/are above first body region(s) 164, 264). First source and drain regions 161-162, 261-262 can be formed in the first active device region 156, 256 on either side of the first channel region(s) 163, 263 and first body region(s) 164, 264. Optionally, first metal silicide layers 168, 268 can be formed on the first source and drain regions and/or the first gate structure(s). Techniques for forming transistors with a single gate or with multiple gate fingers are well known in the art and, thus, the details have been omitted from this specification in order to allow the reader to focus on the salient aspects of the disclosed embodiments. Conventional MOL and BEOL processing can then be performed so that first dielectric material layers 157, 257 (including first dielectric material layer(s) in a first MOL region 158, 258 and first dielectric material layers in a first BEOL region 159, 259 on the first MOL region 158, 258) cover the first transistor 160, 260, so that first contacts extend through the first MOL region 158, 258 to terminals of at least some FEOL first devices (including source, drain and gate terminals of the first transistor 160, 260), and so that, optionally, first conductive wires and vias in the first BEOL region 159, 259 provide electrical pathways from at least some of the first contacts (e.g., the source and/or drain contacts on the first transistor 160, 260) to the outermost surface of the first dielectric material layers 157, 257.

The methods can include forming a second chip (e.g., see second chip 101 in FIG. 3.2A or alternatively in FIG. 3.2B and second chip 201 in FIG. 4.2A or alternatively in FIG. 4.2B). Formation of the second chip 101, 201 can begin with a second semiconductor-on-insulator structure. The second semiconductor-on-insulator structure can be, for example, an SOI structure including: a second semiconductor substrate 102, 202; a second insulator layer 104, 204 on the second semiconductor substrate 102, 202; and a second semiconductor layer on the second insulator layer 104, 204. Optionally, one or more FEOL second devices (e.g., MOSFET(s), BJT(s), diode(s), passive device(s), etc.) could be formed using the second semiconductor layer. For example, FEOL second devices, including a second transistor 110A (see FIG. 3.2A) or a second transistor 110B (see FIG. 3.2B), a second transistor 210A (see FIG. 4.2A) or a second transistor 210B (see FIG. 4.2B), can be formed using the second semiconductor layer. In this case, the second isolation regions 105, 205 can be formed in the second semiconductor layer to define a second active device region 106, 206 for the second transistor. To form the second transistor 110A, a second gate structure 115 (which has gate sidewall spacers) can be formed on the second active device region 106 adjacent a second channel region 113 (which is above a second body region 114) and second source and drain regions 111-112 can be formed in the second active device region 106 on either side of the second channel region 113 and second body region 114. To form the second transistor 110B, a second gate structure 115 (which has gate sidewall spacers) can be formed on the second active device region 106 adjacent to a second channel region 113 (which is above a second body region 114). Second source and drain regions 111-112 can be formed in the second active device region 106 on either side of the second channel region 113 without extending completely through the second active device region 106 and, particularly, through the second body region 114 below. Additionally, a body contact region 116 can be formed in the second active device region 106 immediately adjacent to the second body region 114 and, for example, positioned laterally adjacent to (e.g., optionally laterally surrounded by) the second source region 111. Similar processing can be performed to form the multi-gate finger transistors 210A or 210B, except that multiple second gate structures 215 are formed on the second active device region 206 adjacent to corresponding second channel regions and second source and drain regions are formed on either side of each second channel region. Optionally, second metal silicide layers 118, 218 can be formed on the second source region(s) 111, 211 (and adjacent body contact region 116, 216, if present), on the second drain region(s) 112, 212 and/or on the second gate structure(s) 115, 215. Techniques for forming such a second transistor 110A, 110B, 210A or 210B are well known in the art and, thus, the details have been omitted from this specification in order to allow the reader to focus on the salient aspects of the disclosed embodiments. Conventional MOL and BEOL processing can then be performed so that second dielectric material layers 107, 207 (including second dielectric material layer(s) in a second MOL region 108, 208 and second dielectric material layers in a second BEOL region 109, 209 above the second MOL region 108, 208) cover the second transistor 110A or 110B, 210A or 210B, so that second contacts extend through the second MOL region 108, 208 to terminals of at least some FEOL second devices (e.g., to source, drain and gate terminals of the second transistor 110A, 110B, 210A or 210B, if present), and so that, optionally, second conductive wires and vias in the second BEOL region 109, 209 provide electrical pathways from some second contacts (e.g., from the source and/or drain contacts of the second transistor 110A, 110B, 210A or 210B, if present) to an outermost surface of the second dielectric material layers 107, 207.

The methods can further include flipping the first chip 151, 251 relative to the second chip 101, 201 and stacking the first chip 151, 251 on the second chip 101, 201 so that outermost surfaces of the first dielectric material layers 157, 257 (distal to FEOL first devices, including the first transistor 160, 260) and the second dielectric material layers 107, 207 (distal to FEOL second devices, including the second transistor 110A or 110B, 210A or 210B) are immediately adjacent to each other (see FIG. 3.3 and FIG. 4.3). It should be noted that, during BEOL processing on the first chip 151, 251 and on the second chip 101, 201, patterning of one or more first vias 195, 295 and patterning of one or more second vias 145, 245 can be performed so that, when the first chip 151, 251 is flipped relative to and stacked on the second chip 101, 201, first and second vias will be vertically aligned. Then, the outermost surfaces of the first dielectric material layers 157, 257 and the second dielectric material layers 107, 207 can be bonded together (see bonded outermost surfaces 180). Bonding techniques that will result in dielectric-to-dielectric bonding of adjacent dielectric materials (e.g., of the first and second dielectric material layers) and metal-to-metal bonding (e.g., copper-to-copper bonding) of the adjacent metal materials (e.g., of vertically aligned first and second vias) are well known in the art. Thus, a detailed discussion of such techniques has been omitted from this specification in order to allow the reader to focus on the salient aspects of the disclosed embodiments. However, those skilled in the art will recognize that such techniques typically rely on application of both pressure and relatively high heat.

The methods can further include removing the first semiconductor substrate 152, 252 to expose the first insulator layer 154, 254 (see FIG. 3.4 and FIG. 4.4). Removal of the first semiconductor substrate 152, 252 can be achieved, for example, using a grinding process or any other suitable process. Substrate grinding techniques are well known in the art and, thus, the details thereof have been omitted from this specification in order to allow the reader to focus on the salient aspects of the disclosed embodiments.

The methods can further include forming a trench 301, 401 that extends through the first insulator layer 154, 254 to the first active device region 156, 256 (see FIG. 3.5 and FIG. 4.5). Specifically, to form the 3DIC structure 100A or 100B of FIG. 1A or 1B, this process can be performed so that surfaces of the first source region 161 and first body region 164 are exposed at the bottom of the trench 301 and so that all surfaces of the first drain region 162 continue to remain covered by the first insulator layer 154 (see FIG. 3.5). For example, as illustrated, trench 301 can land on the interface between the first source region and first body region with a first side extending partially over the first source region and a second side extending partially over the first body region. To form the 3DIC structure 200A or 200B of FIG. 2A or 2B, this process can be performed so that surfaces of the first source region 261 and the adjacent first body regions 264 are exposed at the bottom of the trench 401 and so that all surfaces of the first drain regions 262 continue to remain covered by the first insulator layer 254 (see FIG. 3.5). For example, as illustrated, trench 401 can land on the first source region and can have sides that extend partially over the adjacent first body regions. Trenches 301, 401 can be formed using, for example, conventional lithographic patterning and etch techniques.

The methods can further include forming a local interconnect 169, 269 covering the bottom surface of the trench 301, 401 (see FIG. 3.6 and FIG. 4.6). As illustrated in FIG. 3.6, the local interconnect 169 within trench 301 will be immediately adjacent to and, thereby electrically couple the first source region 161 and the adjacent first body region 164. As illustrated in FIG. 4.6, the local interconnect 269 within trench 401 will be immediately adjacent to and, thereby electrically couple the first source region 261 and the adjacent first body regions 264. One technique for forming the local interconnect 169, 269 could be forming a metal silicide layer within trench 301, 401. For example, a metal layer can be conformally deposited over the partially completed structure and, particularly, onto the bottom surface of the trench. An anneal can then be performed to cause the metal layer to react with silicon at the bottom of the trench to form a metal silicide layer. Any remaining metal is then selectively removed. Alternatively, any other suitable technique could be employed to form a local interconnect 169, 269 at the bottom of the trench 301, 401.

The methods can further include forming an additional first insulator layer 190, 290 on the first insulator layer 154, 254 and within the trench 301, 401 over the local interconnect 169, 269 (see FIG. 3.7 and FIG. 4.7). The additional first insulator layer 190, 290 can, for example, be deposited by thermal oxide deposition, chemical vapor deposition (CVD), or any other suitable insulator deposition process. Optionally, a polishing process (e.g., a chemical mechanical polishing (CMP) process) can subsequently be performed to planarize the top surface of the additional first insulator layer 190, 290.

Additional processing can include the formation of through oxide vias (TOVs) including source and drain vias. For example, as illustrated in FIG. 3.8 during formation of the 3DIC structure 100A or 100B of FIG. 1A or 1B, a source via opening 391 and a drain via opening 392 can be formed (e.g., lithographically patterned and etched) such that they extend through the additional first insulator layer 190, through the first insulator layer 154, through first isolation regions 155 and into the first dielectric material layers 157 (particularly, through the first MOL region 158, 258) to first conductive wires 181-182, respectively, within the first metal level (M1) of the first BEOL region 159). The via openings 391-392 can subsequently be filled with metal or metal alloy layer(s) (e.g., copper using conventional plating or other suitable techniques) to form a source via 191 and a drain via 192, respectively. The source via 191 can extend to the first conductive wire 181 and can, thus, be electrically connected to the first source region 161 of the first transistor 160 and to the second source region 111 of the second transistor 110A (or 110B) through electrical pathways in the first and second dielectric material layers. The drain via 192 can extend to the first conductive wire 182 and can, thus, be electrically connected to the first drain region 162 of the first transistor 160 and to the second drain region 112 of the second transistor 110A (or 110B) through different electrical pathways in the first and second dielectric material layers. Similarly, as illustrated in FIG. 4.8 during formation of the 3DIC structure 200A or 200B of FIG. 2A or 2B, a source via opening (not shown) and drain via openings 492 can be formed (e.g., lithographically patterned and etched) such that the source via opening extends to the first conductive wire 281 and such that the drain via openings 492 extend to discrete first conductive wires 282. The via openings can subsequently be filled with metal or metal alloy layer(s) (e.g., copper using conventional plating or other suitable techniques) to form a source via (not shown) and two drain vias 292. The source via can extend to the first conductive wire 281 and can, thus, be electrically connected to the first source region 261 of the first transistor 260 and to the second source region 211 of the second transistor 210A (or 210B) through electrical pathways in the first and second dielectric material layers. Each drain via 292 can extend to a different first conductive wire 282 and can, thus, be electrically to a first drain region 262 of the first transistor 260 and to a second drain region 212 of the second transistor 210A (or 210B) through different electrical pathways extending through the first and second dielectric material layers.

The method can further include additional processing to complete the 3DIC structure 100A of FIG. 1A, 100B of FIG. 1B, 200A of FIG. 2A, 200B of FIG. 2B. This additional processing can include, but is not limited to, the formation of input/output pads on the top surface of the additional first insulator layer 190, 290 (e.g., adjacent to the TOVs); formation of a passivation layer, etc.

In the structures and methods described above, the first semiconductor substrate 152, 252 (also referred to as the sacrificial semiconductor substrate) and the second semiconductor substrate 102, 202 can be monocrystalline semiconductor substrates (e.g., monocrystalline silicon (Si) substrates or substrates of any other suitable monocrystalline semiconductor material). For purposes of this disclosure, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer. It should be noted that the monocrystalline semiconductor material of the first semiconductor substrate 152, 252 and the second semiconductor substrate 102, 202 can be the same or different.

In the structures and methods described above the first insulator layer 154, 254, the additional first insulator layer 190, 290, and the second insulator layer 104, 204 can be oxide layers (e.g., silicon dioxide layers) or layers of any other suitable insulator material. The insulator material of these different insulator layers can be the same or different. The first semiconductor layer (and thereby the first active device region 156, 256 of the first transistor 160, 260) and the second semiconductor layer (and thereby the second active device region 106, 206 of the second transistor 110A or 110B, 210A or 210B) can be monocrystalline semiconductor layers (e.g., monocrystalline Si layers or substrates of any other suitable monocrystalline semiconductor material). The monocrystalline semiconductor material of these two semiconductor layers can be the same or different and the same or different from the monocrystalline semiconductor material of the semiconductor substrate.

In the structures and methods described above, the first isolation regions 155, 255 and the second isolation regions 105, 205 can be STI regions. Each STI region can include a trench that extends through a semiconductor layer to an insulator layer. In each STI region the trench can be filled with one or more layers of isolation material. The isolation material(s) can include silicon oxide, silicon nitride, silicon oxynitride, and/or any other isolation material suitable for use in an STI region.

In the structures and methods described above, the first transistor 160, 260 and, if present, the second transistor 110A or 110B, 210A or 210B can be MOSFETs. These two MOSFETs can be two N-type MOSFETs (NFETs), two P-type MOSFETs (PFETs), an NFET and a PFET, or a PFET and an NFET, respectively. In an NFET the source and drain regions can have N-type conductivity at a relatively high conductivity level (e.g., the source and drain regions can be N+ regions), the body and channel regions can have P-type conductivity at a relatively low conductivity level (e.g., the body and channel regions can be P-regions), and a body contact region (if present) can have P-type conductivity at a relatively high conductivity level (e.g., the body contact region can be a P+ region). In a PFET the source and drain regions can have P-type conductivity at a relatively high conductivity level (e.g., the source and drain regions can be P+ regions), the body and channel regions can have N-type conductivity at a relatively low conductivity level (e.g., the body and channel regions can be N-regions), and a body contact region (if present) can have N-type conductivity at a relatively high conductivity level (e.g., the body contact region can be a N+ region). Furthermore, the gate structure(s) of the two MOSFETs can include a gate stack. The gate stack can include a gate dielectric layer (including one or more layers of gate dielectric material immediately adjacent to an active device region at a channel region) and a gate conductor layer (including one or more layers of gate conductor material) on the gate dielectric layer). The gate stack can further include gate sidewall spacers positioned laterally adjacent to the sidewalls of the gate stack so as to isolate the gate conductor layer from the adjacent source and drain regions. Gate sidewall spacers can include one or more layers of isolation material (e.g., silicon nitride, silicon dioxide, silicon oxynitride, or any other suitable gate sidewall spacer isolation material). Such gate structures can include, for example, gate-first polysilicon gate structures, gate-first metal gate structures or replacement metal gate structures, or any other suitable type of gate structure. Such gate structures are well known in the art and, thus, the details thereof have been omitted from this specification in order to allow the reader to focus on the salient aspects of the disclosed embodiments.

In the structures and methods described above, the first metal silicide layers 168, 268, the second metal silicide layers 118, 218 and, if applicable, a metal silicide layer of the local interconnect 169, 269 can be a silicide of any suitable metal material. For example, each of these metal silicide layers could be a cobalt silicide layer, a nickel silicide layer, a tungsten silicide layer, a titanium silicide layer, or a layer of any other suitable metal silicide material. Furthermore, these metal silicide layers can all be made of the same metal silicide or the first metal silicide layers, the second metal silicide layers and/or the local interconnect could be made of different metal silicide materials.

In the structures and methods described above, the first and second contacts within the first and second MOL regions 158, 258 and 108, 208 can be, for example, tungsten contacts, cobalt contacts or contacts made with any other suitable MOL contact material. The first and second conductive wires within the first and second BEOL regions 159, 259 and 109, 209 can be made, for example, of aluminum, copper, and/or any other suitable BEOL metal materials. The first vias 195, 295 and second vias 145, 245 in the last BEOL metal levels (Mx) on each chip can specifically be made of a metal material suitable for surface-to-surface bonding (e.g., copper). TOVs can further be made of the same metal as that used in the BEOL conductive wires and vias or a different metal (e.g., copper).

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising, "includes" and/ or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first chip; and
a second chip, wherein the first chip is stacked on the second chip and includes:
    first dielectric material layers adjacent to the second chip;
    a first insulator layer;
    a first transistor including a first active device region stacked vertically between the first dielectric material layers and the first insulator layer,
        wherein, within the first active device region, the first transistor includes:
    a first source region; a first drain region; a first channel region; and a first body region on the first channel region,
        wherein the first channel region and the first body region are positioned laterally between the first source region and the first drain region, and wherein the first transistor further includes a first gate structure within the first dielectric material layers immediately adjacent to a surface of the first active device region at the first channel region; and
    a local interconnect within the first insulator layer immediately adjacent to another surface of the first active device region opposite the first gate structure, wherein the local interconnect electrically couples the first body region and the first source region.

2. The structure of claim 1, wherein the local interconnect includes a metal silicide layer.

3. The structure of claim 1, wherein the first chip further includes:
an additional first insulator layer on the first insulator layer and within a trench over the local interconnect; and
a source via and a drain via extending through the additional first insulator layer, through the first insulator layer, through first isolation regions, and into the first dielectric material layers to two first conductive wires, wherein the two first conductive wires are electrically connected to the first source region and the first drain region, respectively.

4. The structure of claim 1, wherein the second chip further includes:
a semiconductor substrate;
a second insulator layer on the semiconductor substrate;
a device on the second insulator layer; and
second dielectric material layers on the second insulator layer and extending over the device, wherein a first outermost surface of the first dielectric material layers and a second outermost surface of the second dielectric material layers are bonded.

5. The structure of claim 4, wherein the device includes a second transistor having a floating body region.

6. The structure of claim 4, wherein the device includes a second transistor having a contacted body region.

7. The structure of claim 4, wherein the first dielectric material layers include first conductive wires and vias electrically connected to the first transistor and having at least one first via at the first outermost surface, wherein the second dielectric material layers include second conductive wires and vias electrically connected to the device and having at least one second via at the second outermost surface, and wherein the at least one first via and the at least one second via are bonded and the first transistor and the device are electrically connected.

8. A structure comprising:
a first chip; and
a second chip, wherein the first chip is stacked on the second chip and includes:
first dielectric material layers adjacent to the second chip;
a first insulator layer;
a first transistor including a first active device region stacked vertically between the first dielectric material layers and the first insulator layer,
wherein, within the first active device region, the first transistor includes:
first drain regions; a first source region; first channel regions; and first body regions on the first channel regions, respectively,
wherein each first channel region and corresponding first body region on the first channel region are positioned laterally between the first source region and one of the first drain regions, and
wherein the first transistor further includes first gate structures within the first dielectric material layers immediately adjacent to a surface of the first active device region at the first channel regions, respectively; and
a local interconnect within the first insulator layer immediately adjacent to another surface of the first active device region opposite the first gate structure, wherein the local interconnect electrically couples the first source region and the first body regions.

9. The structure of claim 8, wherein the local interconnect is at a bottom of a trench that extends through the first insulator layer and includes a metal silicide layer.

10. The structure of claim 8, wherein the local interconnect is at a bottom of a trench and wherein the first chip further includes:
an additional first insulator layer on the first insulator layer and within the trench over the local interconnect; and
multiple vias including at least two drain vias extending through the additional first insulator layer, through the first insulator layer, through first isolation regions, and into the first dielectric material layers to two first conductive wires, respectively, wherein the two first conductive wires are electrically connected to the first drain regions, respectively.

11. The structure of claim 8, wherein the second chip further includes:
a semiconductor substrate;
a second insulator layer on the semiconductor substrate;
a device on the second insulator layer; and
second dielectric material layers on the second insulator layer and extending over the device, wherein a first outermost surface of the first dielectric material layers and a second outermost surface of the second dielectric material layers are bonded.

12. The structure of claim 11, wherein the device includes a second transistor having floating body regions.

13. The structure of claim 11, wherein the device includes a second transistor having a contacted body region.

14. The structure of claim 11, wherein the first dielectric material layers include first conductive wires and vias electrically connected to the first transistor and having at least one first via at the first outermost surface, wherein the second dielectric material layers include second conductive wires and vias electrically connected to the device and having at least one second via at the second outermost surface, and wherein the at least one first via and the at least one second via are bonded and the first transistor and the device are electrically connected.

15. A method comprising:
forming a first chip;
forming a second chip;
stacking the first chip on the second chip, wherein the first chip includes:
first dielectric material layers adjacent to the second chip;
a first insulator layer; and
a first transistor between the first dielectric material layers and the first insulator layer, wherein the first transistor includes: a first source region; a first drain region; a first channel region; a first body region on the first channel region, wherein the first channel region and the first body region are positioned laterally between the first source region and the first drain region; and a first gate structure between the first channel region and the first dielectric material layers;
forming a trench that extends through the first insulator layer to the first source region and the first body region; and
forming a local interconnect within the trench immediately adjacent to the first source region and the first body region.

16. The method of claim 15, wherein the forming of the local interconnect includes forming a metal silicide layer at a bottom of the trench.

17. The method of claim 15,
wherein the forming of the first chip initially includes: a first semiconductor substrate; the first insulator layer on the first semiconductor substrate; and a first semiconductor layer on the first insulator layer, and
wherein the stacking of the first chip on the second chip includes flipping the first chip relative to the second chip.

18. The method of claim 17, further comprising:
after the stacking, removing the first semiconductor substrate to expose the first insulator layer and forming the trench;
forming an additional first insulator layer on the first insulator layer and within the trench over the local interconnect; and
forming a source via and a drain via extending through the additional first insulator layer, through the first insulator layer, through first isolation regions, and into the first dielectric material layers to two first conductive wires, wherein the two first conductive wires are electrically connected to the first source region and the first drain region, respectively.

19. The method of claim 15, wherein the second chip includes: a second semiconductor substrate; a second insulator layer on the second semiconductor substrate; a device on the second insulator layer; and second dielectric material layers on the second insulator layer and extending over the device.

20. The method of claim 19, wherein the forming of the first chip includes forming first conductive wires and vias in the first dielectric material layers, electrically connected to the first transistor layer, and having at least one first via at a first outermost surface, wherein the forming of the second chip includes forming second conductive wires and vias in the second dielectric material layers, electrically connected to the device, and having at least one second via at a second outermost surface, and wherein the stacking includes aligning the first chip over the second chip so that the at least one first via is aligned with the at least one second via and bonding the first outermost surface to the second outermost surface so that the at least one first via and the at least one second via are also bonded and the first transistor and the device are electrically connected.

* * * * *